United States Patent
Darwish et al.

(10) Patent No.: US 8,957,473 B2
(45) Date of Patent: Feb. 17, 2015

(54) MOS-GATED POWER DEVICES, METHODS, AND INTEGRATED CIRCUITS

(71) Applicant: MaxPower Semiconductor, Inc., Santa Clara, CA (US)

(72) Inventors: Mohamed N. Darwish, Campbell, CA (US); Jun Zeng, Torrance, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 0 days.

(21) Appl. No.: 13/735,506

(22) Filed: Jan. 7, 2013

(65) Prior Publication Data

US 2014/0117439 A1 May 1, 2014

Related U.S. Application Data

(63) Continuation of application No. 12/626,589, filed on Nov. 25, 2009, now Pat. No. 8,378,416.

(60) Provisional application No. 61/118,664, filed on Dec. 1, 2008, provisional application No. 61/122,794, filed on Dec. 16, 2008.

(51) Int. Cl.
| | |
|---|---|
| *H01L 29/78* | (2006.01) |
| *H01L 29/06* | (2006.01) |
| *H01L 29/40* | (2006.01) |
| *H01L 29/08* | (2006.01) |
| *H01L 29/10* | (2006.01) |
| *H01L 29/423* | (2006.01) |

(52) U.S. Cl.
CPC ........ *H01L 29/7802* (2013.01); *H01L 29/0634* (2013.01); *H01L 29/0653* (2013.01); *H01L 29/402* (2013.01); *H01L 29/407* (2013.01); *H01L 29/408* (2013.01); *H01L 29/7811* (2013.01); *H01L 29/7813* (2013.01); *H01L 29/0661* (2013.01); *H01L 29/0878* (2013.01); *H01L 29/1095* (2013.01); *H01L 29/4236* (2013.01); *H01L 29/42368* (2013.01); *H01L 29/42376* (2013.01)
USPC ........... 257/330; 257/329; 257/331; 257/332; 257/E29.257; 438/270; 438/271; 438/589

(58) Field of Classification Search
CPC ............ H01L 29/0634; H01L 29/0653; H01L 29/402; H01L 29/7813; H01L 29/408; H01L 29/7802; H01L 29/7811; H01L 29/407; H01L 29/0661; H01L 29/0878; H01L 29/1095
USPC .................. 257/329, 330, 331, 332, E29.257; 438/270, 271, 589
See application file for complete search history.

(56) References Cited

U.S. PATENT DOCUMENTS 6,649,975 B2 * 11/2003 Baliga ........................... 257/330

* cited by examiner

*Primary Examiner* — Thinh T Nguyen
(74) *Attorney, Agent, or Firm* — Gwendolyn S. S. Groover; Robert O. Groover, III; Groover & Associates PLLC

(57) ABSTRACT

MOS-gated devices, related methods, and systems for vertical power and RF devices including an insulated trench and a gate electrode. A body region is positioned so that a voltage bias on the gate electrode will cause an inversion layer in the body region. Permanent electrostatic charges are included in said insulation material. A conductive shield layer is positioned above the insulated trench, to reduce parasitic capacitances.

20 Claims, 25 Drawing Sheets

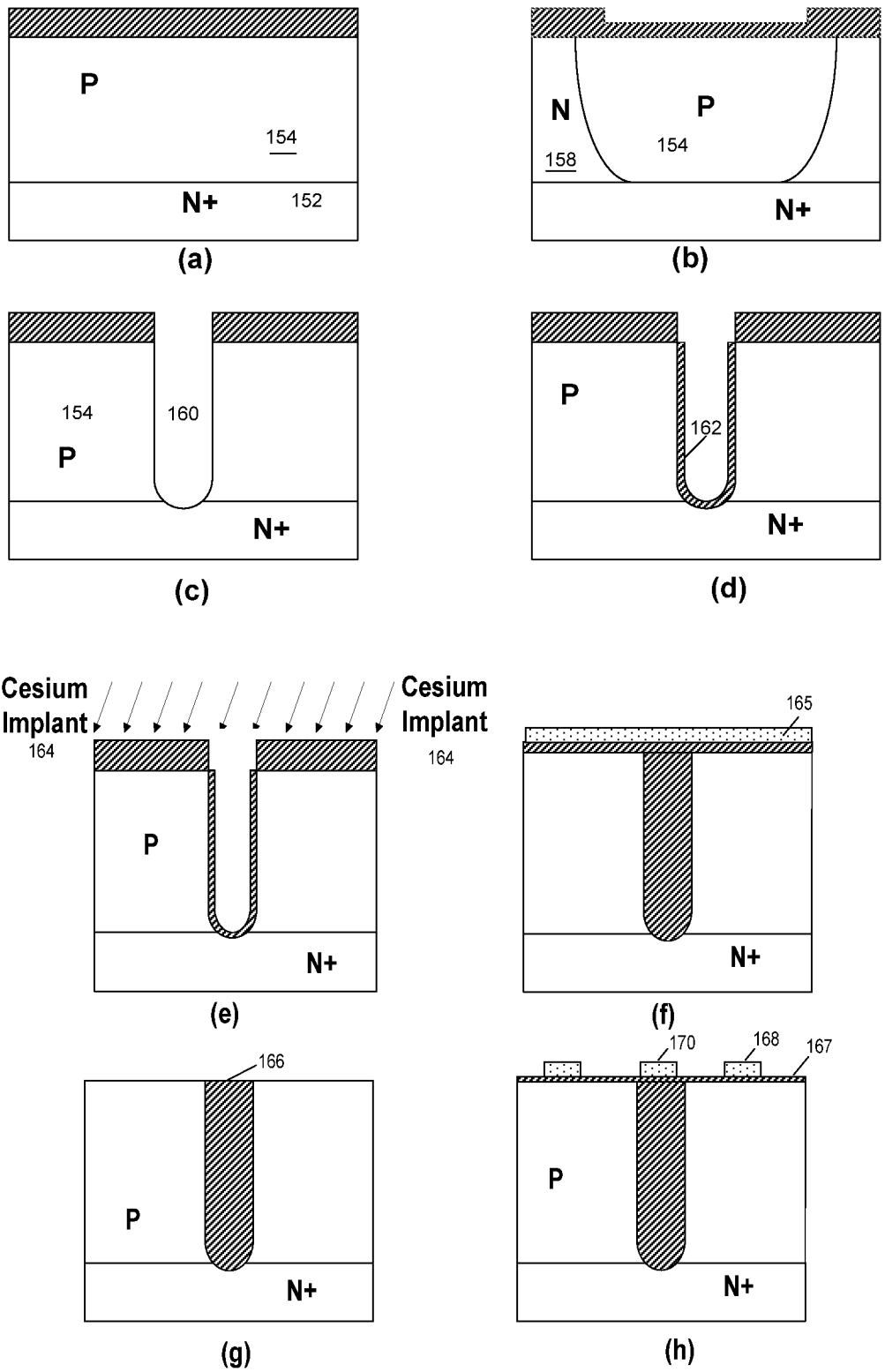
FIG 14 (a)-(h)

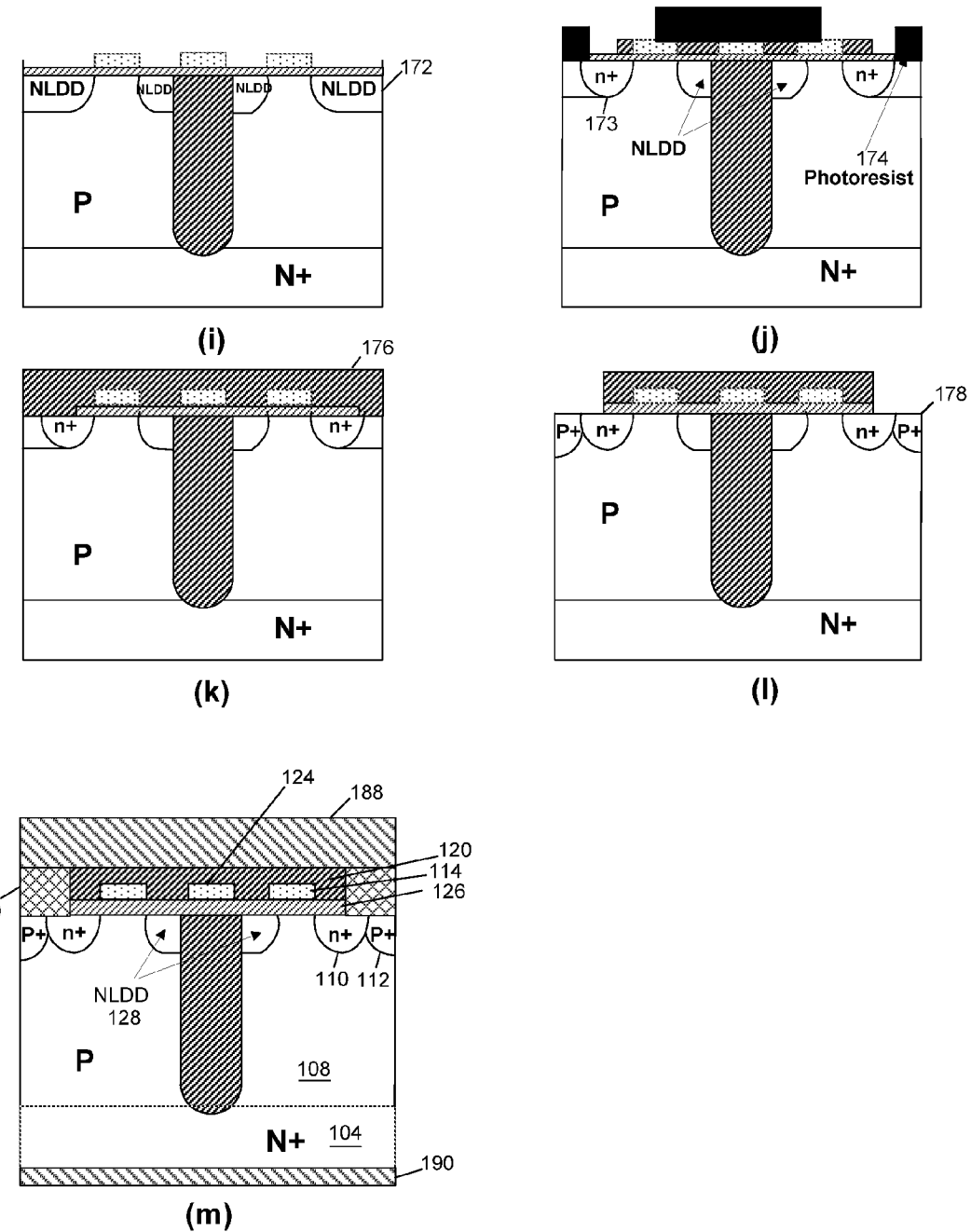
Fig. 14 (i)-(m)

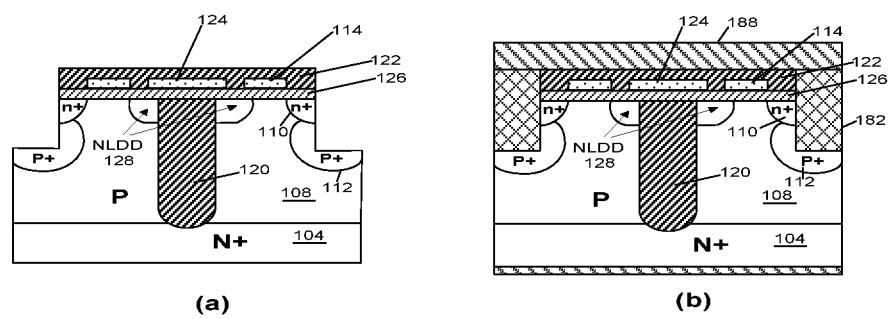
FIG 15 (a)-(b)

MOS-GATED POWER DEVICES, METHODS, AND INTEGRATED CIRCUITS

CROSS-REFERENCE

Priority is claimed from U.S. Application No. 61/118,664, filed Dec. 1, 2008, and also from U.S. Application No. 61/122,794, filed Dec. 16, 2008, both of which are hereby incorporated by reference. The same priority is also claimed by U.S. application Ser. No. 12/626,523, filed simultaneously herewith, and hereby incorporated by reference.

BACKGROUND

The present application relates to power and High Frequency (RF) MOS-gated transistors, and more particularly to CMOS compatible MOSFET structure and fabrication.

Note that the points discussed below may reflect the hindsight gained from the disclosed inventions, and are not necessarily admitted to be prior art.

Power MOSFETs are widely used as switching devices in many electronic applications. In order to minimize conduction power loss it is desirable that power MOSFETs have low specific on-resistance (Rsp), which is defined as the product of the on-resistance of a device and its area. A schematic cross section of a conventional trench MOSFET is shown in FIG. 1. A drain metallization layer 102 underlies an n+ deep drain region 104. A more lightly doped drift layer (or shallow drain) 106 overlies the deep drain region 104, and lies beneath a p-type body region 108 and an insulated trench. A gate electrode 114, typically formed of polysilicon, is positioned within the trench, and surrounded by insulation 116 (typically silicon dioxide). A source region 110 adjoins the trench insulation 116, and overlies at least part of the body region 108. A p+ body contact region 112 adjoins the body region 108, shorting the body region 108 to the source 110. The upper surface of the body contact region 112 and the source region 110, in this example, constitutes an upper silicon surface which is contacted by source metallization 103. When the gate electrode 114 is charged, an inversion layer is formed at the interface between the trench insulation 116 and the body region 108, allowing majority carriers (electrons in this example) to flow from source 110 to drain 104.

A trench MOSFET provides a lower specific on-resistance $R_{sp}$ as the cell pitch decreases, due to the high packing density or number of cells per unit area. Furthermore, to minimize switching losses it is desirable to have a switch with lower gate-source ($C_{gs}$) and gate-drain ($C_{gd}$) capacitances which are directly proportional to lower gate charge ($Q_g$) and gate-drain charge ($Q_{gd}$). Ideally, a power MOS transistor should have low charges $Q_g$ and $Q_{gd}$, as well as a low specific on-resistance $R_{sp}$.

The use of permanent or fixed electrostatic charges has been demonstrated to fabricate devices such as depletion mode DMOS transistors and solar cells. Some high voltage devices have been disclosed that incorporate fixed or permanent positive charges ($Q_F$) that balance the charge of the silicon depletion layer, see for example published US application 2008/064518.

SUMMARY

The present inventors have realized that a key obstacle in integrating lateral-channel trench power devices into conventional integrated circuit processes is the parasitic coupling between the lateral-channel stage and the drain. This parasitic coupling can be surprisingly high.

The present application discloses new kinds of CMOS compatible power and Radio Frequency (RF) MOSFET structures which provide reduced conduction and switching power losses, as well as methods of making and using them, and integrated devices which include them. The disclosed structures preferably include a shielded MOS gate component and a vertical voltage sustaining component. Preferably a deep trench, below the shield, contains permanent charge.

The disclosed innovations, in various embodiments, provide one or more of at least the following advantages. However, not all of these advantages result from every one of the innovations disclosed, and this list of advantages does not limit the various claimed inventions.

The shielded MOS gate component allows the use of industry standard CMOS process and fine dimensions to significantly improve device characteristics and simplify manufacture.

The gate electrode is shielded from the drain, which results in lower $C_{gd}$ capacitance, and hence lower gate charge $Q_{gd}$.

The gate electrode has minimum overlap with the source junction, which results in lower $C_{gs}$ capacitance, and hence lower gate charge $Q_{gs}$.

In some embodiments gate capacitances are synergistically reduced by both $C_{gs}$ and $C_{gd}$ reductions, further reducing gate charge.

High cell density is combined with ease of manufacture.

Some embodiments provide "smart power" integrated structures, in which power devices are integrated into conventional integrated circuit processes, with good process compatibility and minimal added process burden.

Improved on-state conduction.

Reduced switching power loss.

Improved switching speed.

BRIEF DESCRIPTION OF THE DRAWINGS

The disclosed inventions will be described with reference to the accompanying drawings, which show important sample embodiments and which are incorporated in the specification hereof by reference, wherein:

FIGS. 14(a)-(m) are a sequence of cross-sectional structural diagrams depicting stages in fabrication of devices, in accordance with yet another embodiment.

FIGS. 15(a)-(b) are cross-sectional structural diagrams depicting stages in fabrication of devices, in accordance with yet another embodiment.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 1:
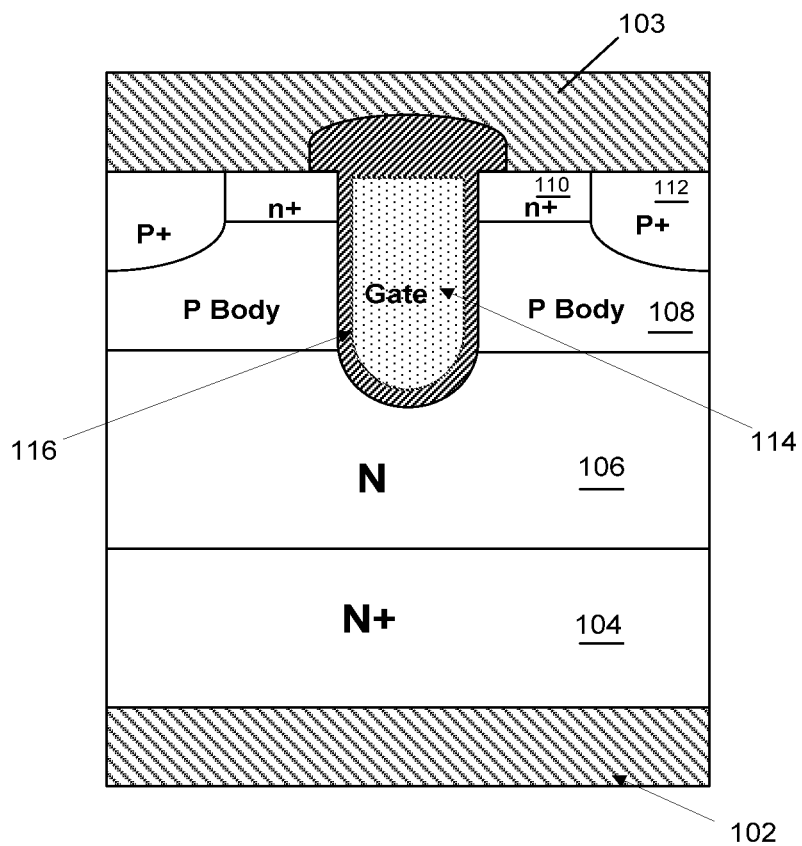
FIG. 1 is a cross-sectional structural diagram of a previously disclosed trench MOSFET.
Figure 2:
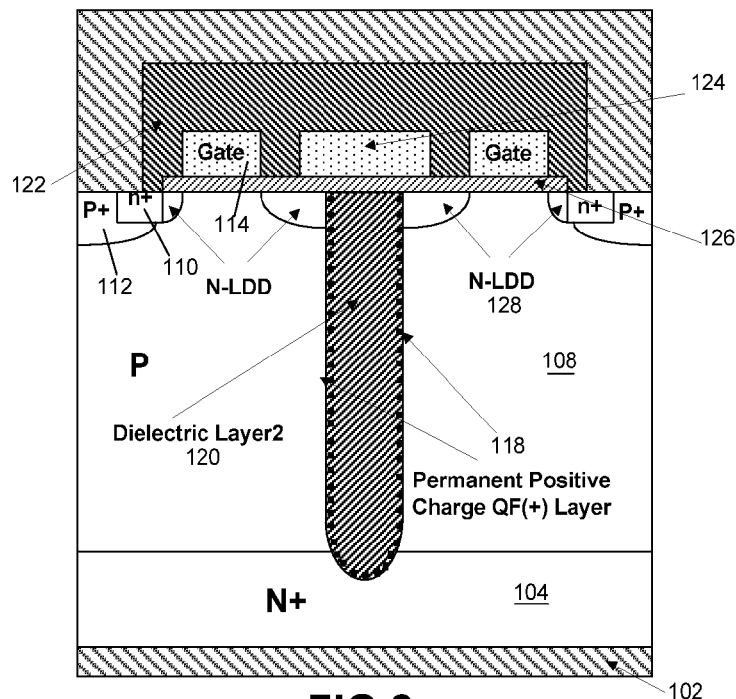
FIG. 2 is a cross-sectional structural diagram of a trench MOSFET in accordance with a group of sample embodiments.

FIG. 2 shows a new kind of merged device, in which a shallow lateral switching device is combined with a vertical voltage-withstand structure, AND a shield is used to reduce capacitive coupling between the two. With reference to FIG. 2, the vertical component of the device can be made from a p-layer 108 on n+ substrate 104 and a dielectric layer 120 that contains permanent or fixed electrostatic charge 118. The structures provide charge induced junctions for current conduction by using dielectric layers 120 that have intentionally introduced permanent (immobile) or fixed charge 118. Permanent charge 118 can be supplied for instance, by the implantation of certain atomic species such as cesium into oxide, or by the use of dielectric layers 120 and plasma enhanced CVD silicon nitride. The permanent charge 118 creates an inversion layer at the silicon-dielectric layer (oxide) interface forming an induced junction that conducts current in the on-state. This structure allows the use of short channel lengths, which helps to achieve lower specific on-resistance $R_{sp}$. The p-layer 108 can be formed by a p-epitaxial layer or alternatively by a p-well implanted in a n-epitaxial layer (not shown) over the n+ substrate 104. The disclosed trench MOSFET structures provide low values for specific on-resistance $R_{sp}$, and for gate charges $Q_g$ and $Q_{gd}$. Further details and innovative embodiments are described below.

In one embodiment, as shown in FIG. 2, the basic cell structure of an n-channel MOSFET is shown. The gate electrode 114 is covered by a surface insulation layer 122, typically a dielectric material, that extends above the silicon surface. A gate dielectric layer 126 is between the gate electrode 114 and the p-layer 108. A conductive shield layer 124, typically formed with a conductive material such as polysilicon and preferably connected to the source or ground, shields the gate electrode 114 thereby lowering the gate-drain capacitance. An insulated trench 120, typically filled with a dielectric material, contains permanent or fixed positive charge 118. Surface insulation layer 122 and insulation trench 120 can be made of different materials, such as silicon oxide, silicon nitride or any appropriate dielectric. Alternatively, both insulation layers 122 and 120 can be made of the same dielectric material, for example SiO2. A lightly doped n-layer (NLDD) 128 is preferably self aligned to the gate 114, and a p+ contact region 112 is provided adjacent to the n+ source layer 110 to provide a source-body short. This embodiment provides advantages as described above.

Figure 3:
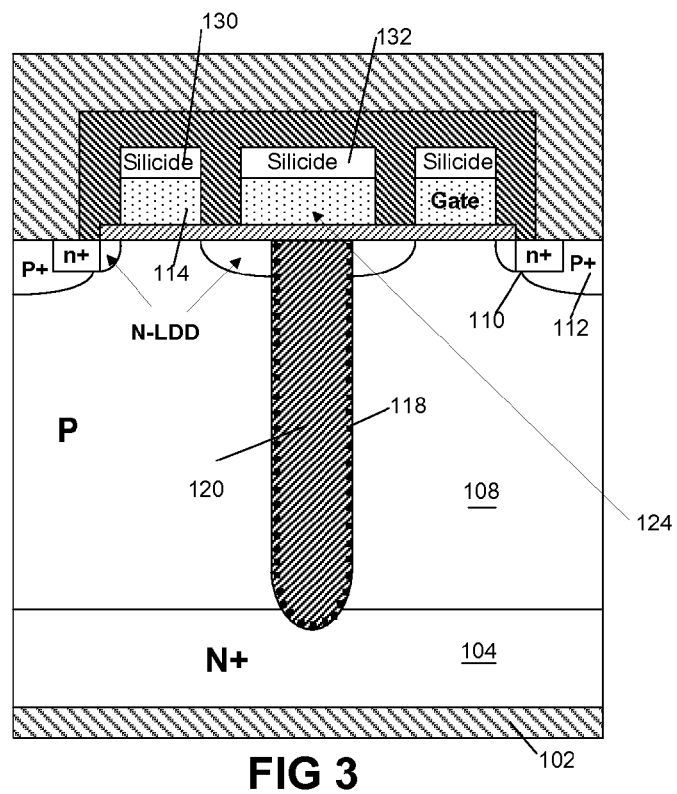
FIG. 3 is a cross-sectional structural diagram depicting a trench MOSFET, in accordance with another embodiment.

FIG. 3 shows an embodiment which is generally somewhat similar to that shown in FIG. 2, but which also includes silicided gate layers 130 and a silicided shield electrode 132. The silicidation of the polysilicon gate electrode 114 provides a silicide layer 130 for lower gate resistance $R_g$. This embodiment too provides advantages as described above.

Figure 4A:
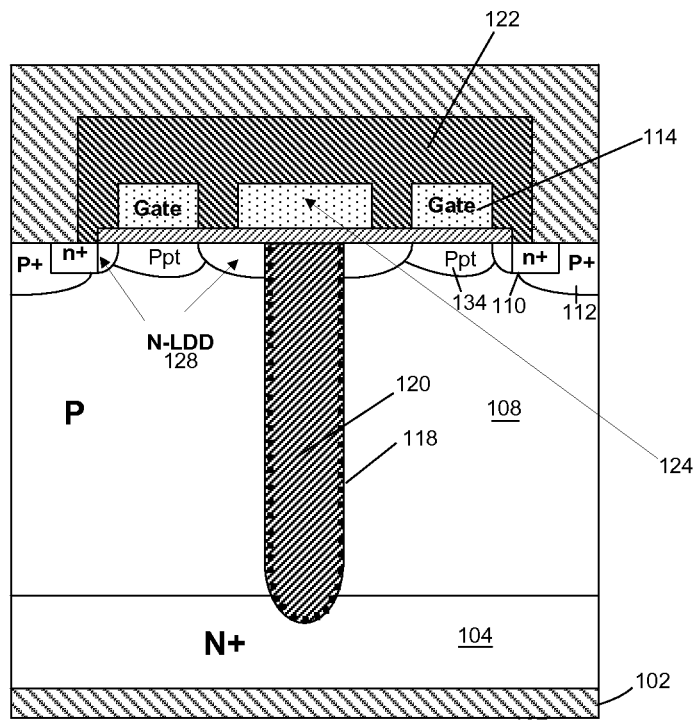
FIG. 4(a) is a cross-sectional structural diagram depicting a trench MOSFET, in accordance with yet another embodiment.

FIG. 4(a) shows an embodiment which is generally somewhat similar to the device shown in FIG. 2, but which also includes an additional anti-punch-through and/or a threshold voltage adjust implant (Ppt) 134. This embodiment too provides advantages as described above.

Figure 4B:
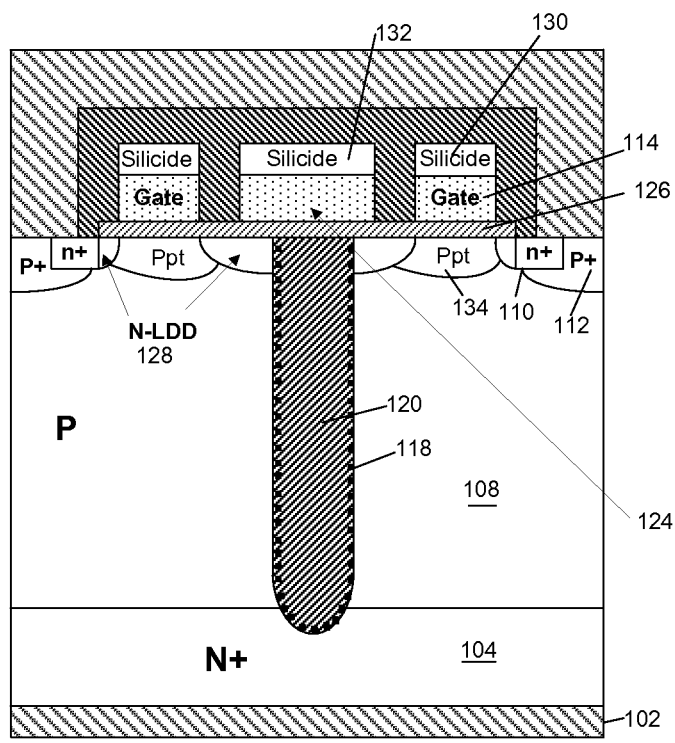
FIG. 4(b) is a cross-sectional structural diagram depicting a trench MOSFET, in accordance with yet another embodiment.

FIG. 4(b) shows an embodiment with silicided gate layer 130 and anti-punch-through layer 134. This embodiment too provides advantages as described above.

Figure 5:
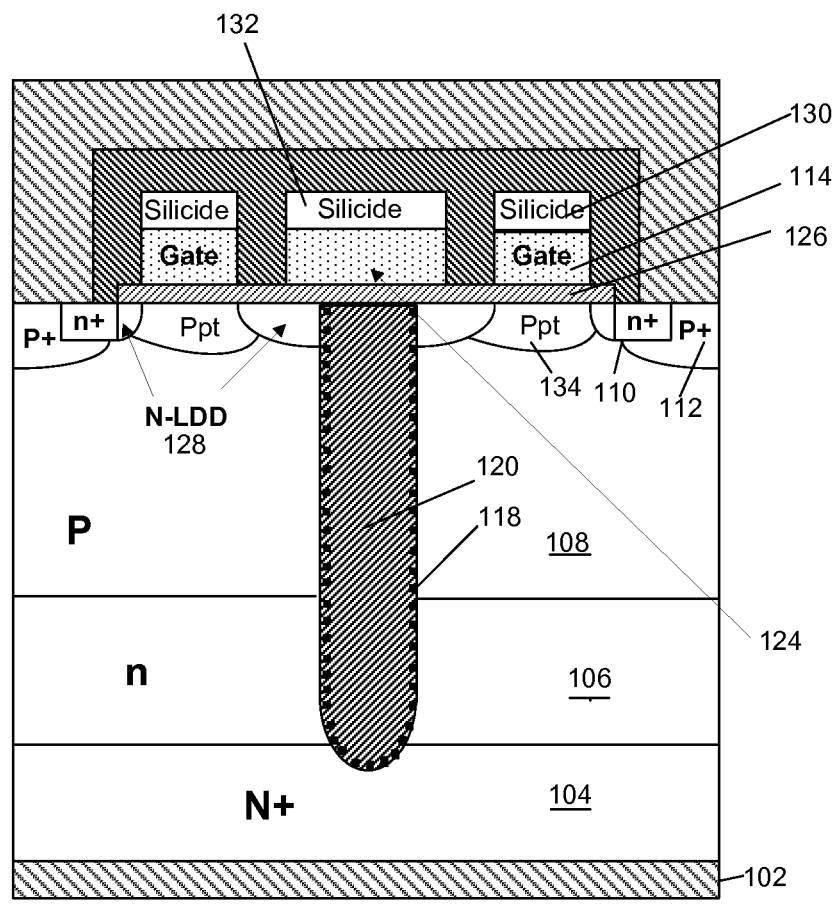
FIG. 5 is a cross-sectional structural diagram depicting a trench MOSFET, in accordance with yet another embodiment.

FIG. 5 shows an embodiment which is generally somewhat similar to that of FIG. 4(b), but which also includes an n-drift layer 106 between the p-layer 108 and the n+ substrate 104. This embodiment too provides advantages as described above.

Figure 6A:
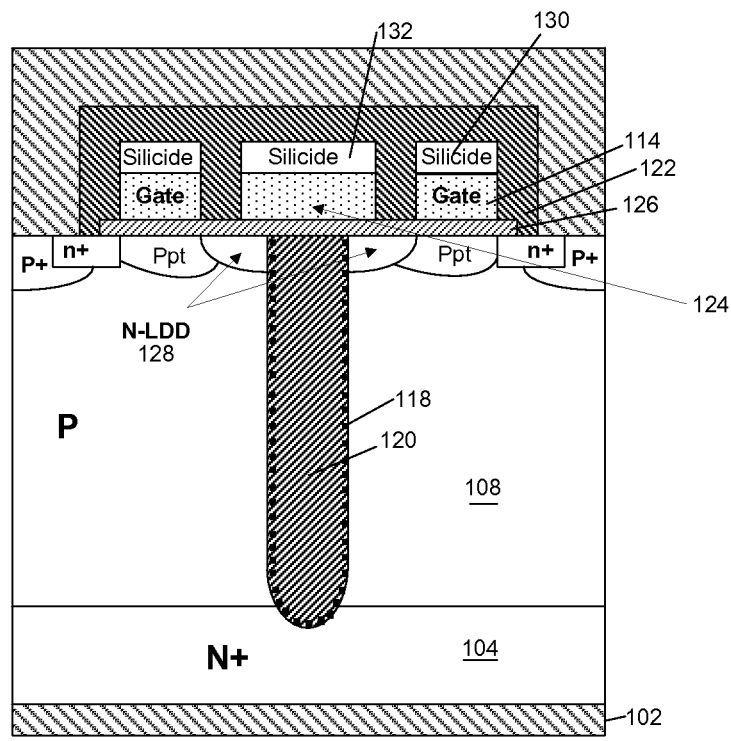
FIG. 6(a) is a cross-sectional structural diagram depicting a trench MOSFET, in accordance with yet another embodiment.

FIG. 6(a) shows an embodiment which is generally somewhat similar to that shown in FIG. 4(b), except that the n+ source 110 extends to the outer edge of the gate 114. This embodiment too provides advantages as described above.

Figure 6B:
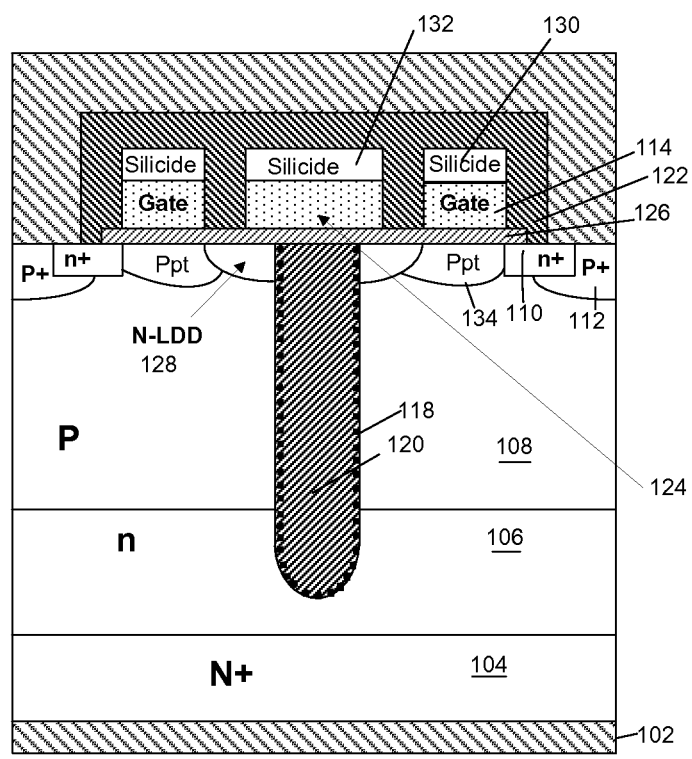
FIG. 6(b) is a cross-sectional structural diagram depicting a trench MOSFET, in accordance with yet another embodiment.

FIG. 6(b) shows an embodiment which is generally somewhat similar to that shown in FIG. 6(a), but which also includes an n drift layer 106 between the p-layer 108 and the n+ substrate 104. This embodiment too provides advantages as described above.

Figure 6C:
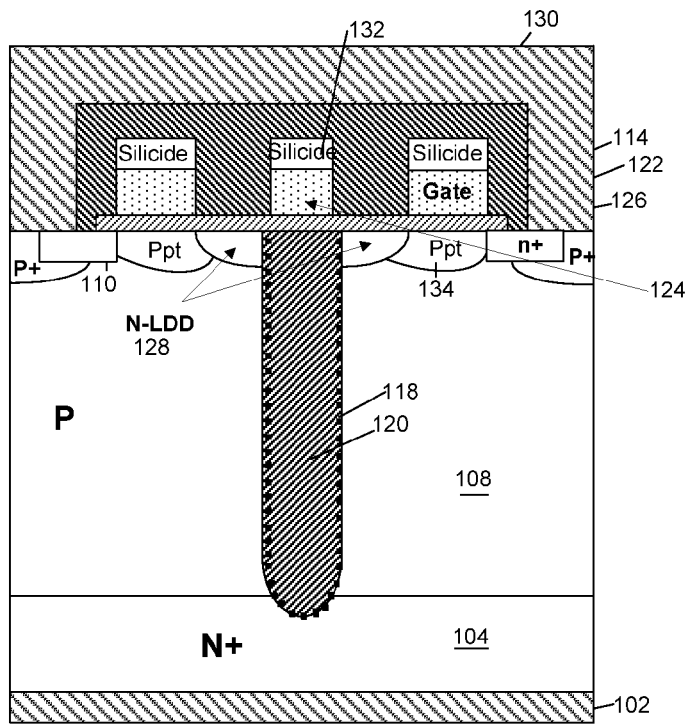
FIG. 6(c) is a cross-sectional structural diagram depicting a trench MOSFET, in accordance with yet another embodiment.

FIG. 6(c) shows an embodiment which is generally somewhat similar to that shown in FIG. 6(a), except that the shield electrode 124 does not overlap the edge of the insulated trench 120. This embodiment too provides advantages as described above.

Figure 6D:
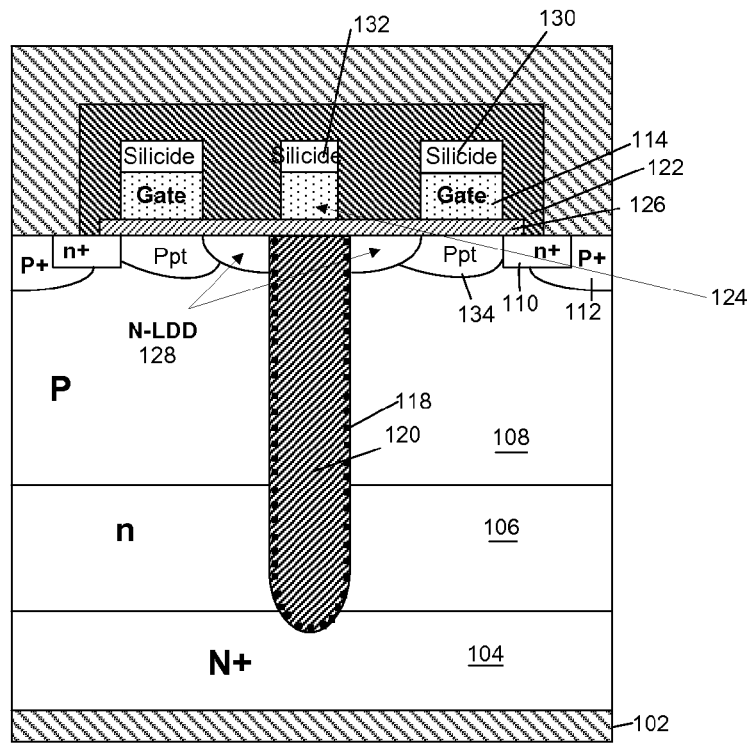
FIG. 6(d) is a cross-sectional structural diagram depicting a trench MOSFET, in accordance with yet another embodiment.

FIG. 6(d) shows an embodiment which is generally somewhat similar to that shown in FIG. 6(c), but which also includes an n-drift layer 106 between the p-layer 108 and the n+ substrate 104. This embodiment too provides advantages as described above.

Figure 7A:
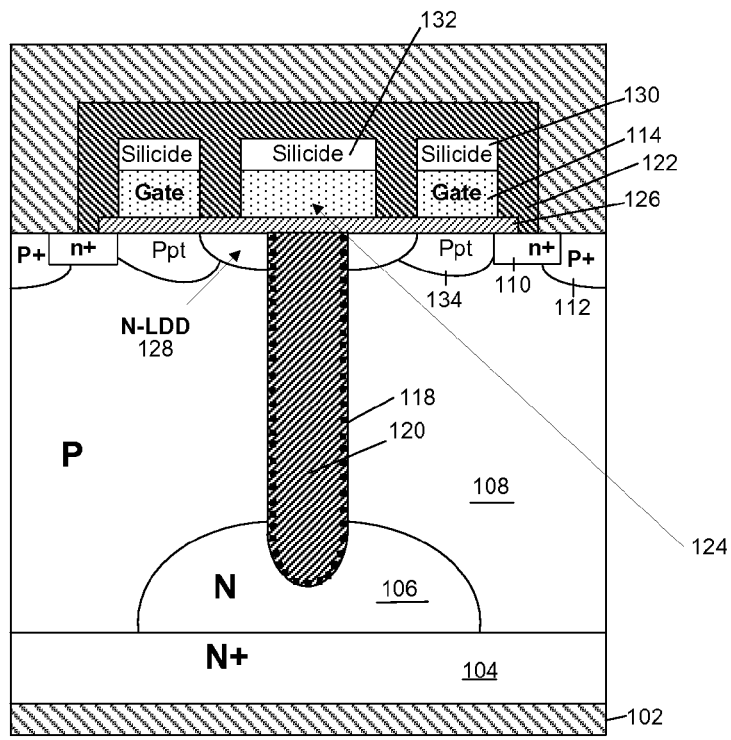
FIG. 7(a) is a cross-sectional structural diagram depicting a trench MOSFET, in accordance with yet another embodiment.

FIG. 7(a) depicts an embodiment including an drift n-layer 106 implanted at the bottom of the insulation trench 120. Layer 106 can be formed by a single n-type implant or a series of implants with different energies to connect the trench to the N+ substrate 104. This embodiment too provides advantages as described above.

Figure 7B:
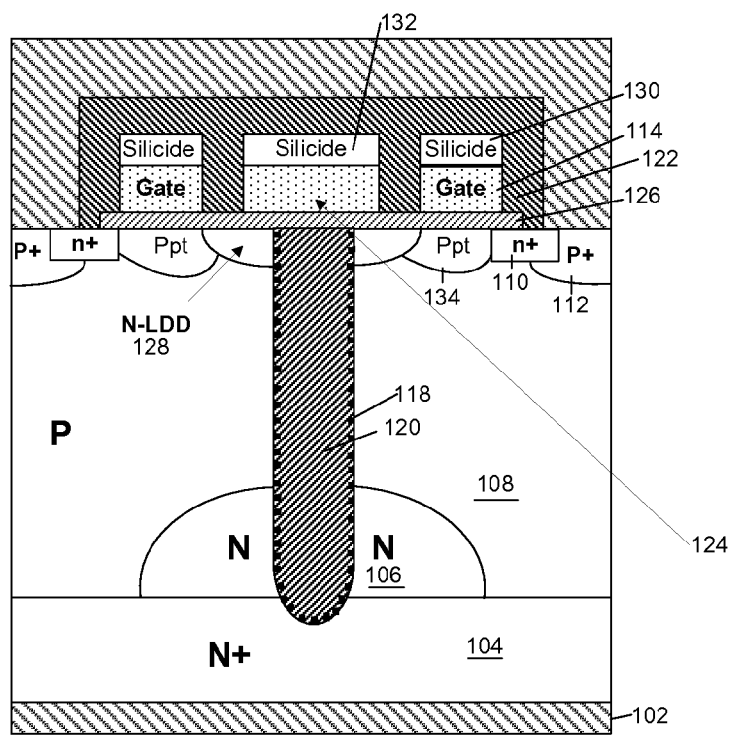
FIG. 7(b) is a cross-sectional structural diagram depicting a trench MOSFET, in accordance with yet another embodiment.

FIG. 7(b) depicts an embodiment which is generally somewhat similar to that of FIG. 7(a), but which also includes a silicide layer 130 on the gate electrode 114 and a silicide layer 132 on the shield electrode 124. Note that in this embodiment, unlike that of FIG. 7(a), the trench extends all the way to the substrate 104. This embodiment too provides advantages as described above.

Figure 8A:
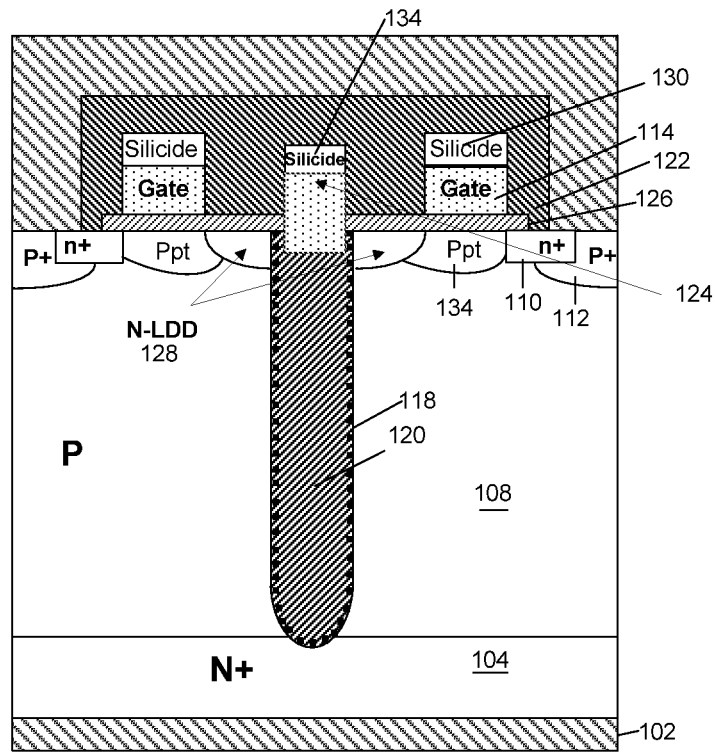
FIG. 8(a) is a cross-sectional structural diagram depicting a trench MOSFET, in accordance with yet another embodiment.

FIG. 8(a) depicts an embodiment including a partially recessed shield electrode 124 extending beyond the level of the upper silicon surface. This embodiment too provides advantages as described above.

Figure 8B:
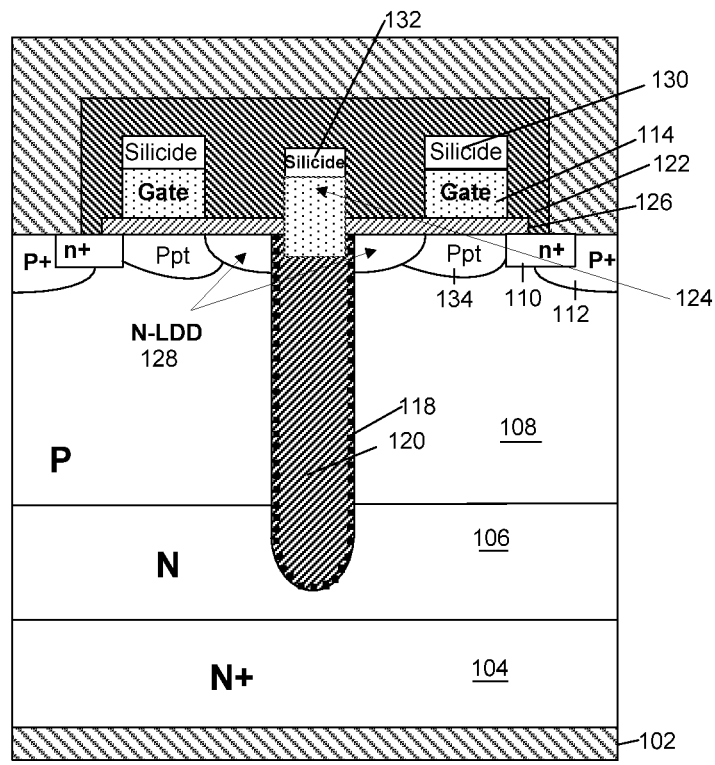
FIG. 8(b) is a cross-sectional structural diagram depicting a trench MOSFET, in accordance with yet another embodiment.

FIG. 8(b) depicts an embodiment which is generally somewhat similar to FIG. 8(a), but which also includes a drift layer 106. This embodiment too provides advantages as described above.

Figure 9A:
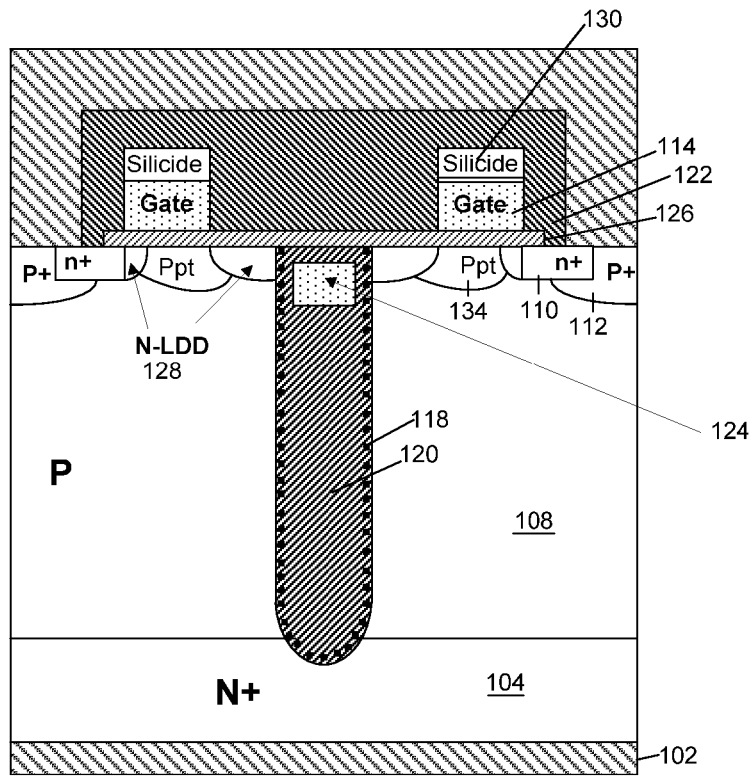
FIG. 9(a) is a cross-sectional structural diagram depicting a trench MOSFET, in accordance with yet another embodiment.

FIG. 9(a) depicts an embodiment including a recessed shield electrode 124 positioned within the insulation trench 120, below the upper silicon surface. This embodiment too provides advantages as described above.

Figure 9B:
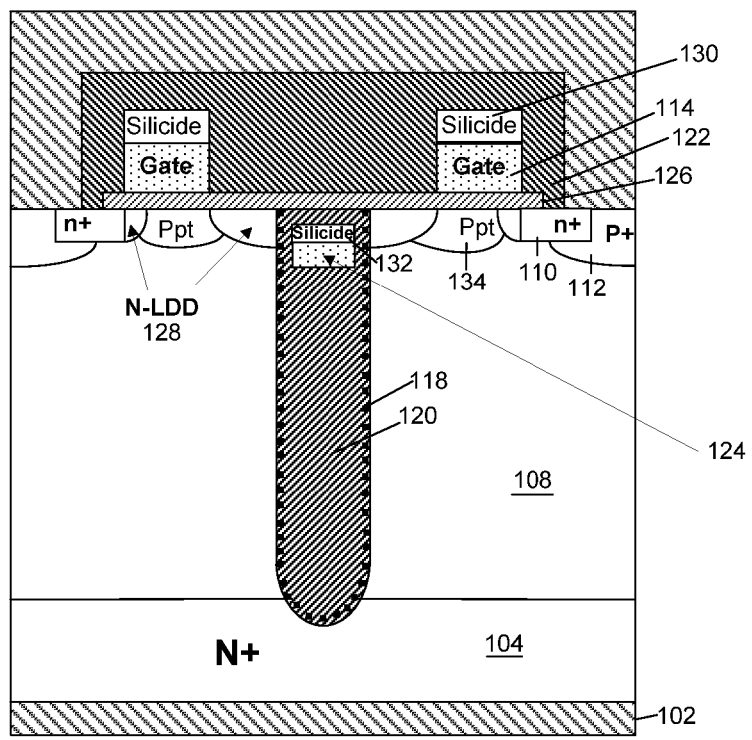
FIG. 9(b) is a cross-sectional structural diagram depicting a trench MOSFET, in accordance with yet another embodiment.

FIG. 9(b) depicts an embodiment which is generally somewhat similar to FIG. 9(a), but which also includes a silicide layer 132 on the shield electrode 124. This embodiment too provides advantages as described above.

Figure 9C:
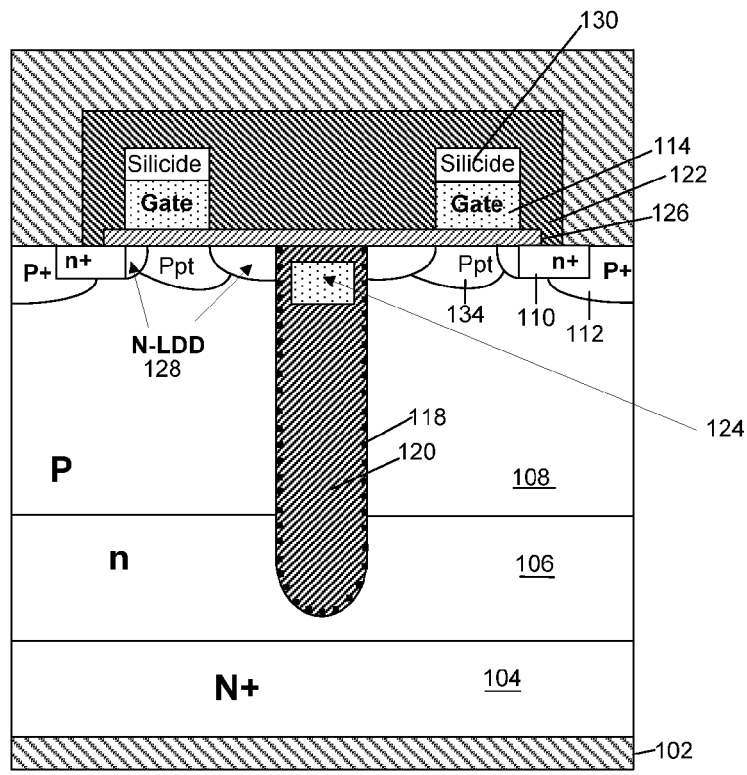
FIG. 9(c) is a cross-sectional structural diagram depicting a trench MOSFET, in accordance with yet another embodiment.

FIG. 9(c) depicts an embodiment which is generally somewhat similar to FIG. 9(a), but which also includes a drift layer 106. This embodiment too provides advantages as described above.

Figure 9D:
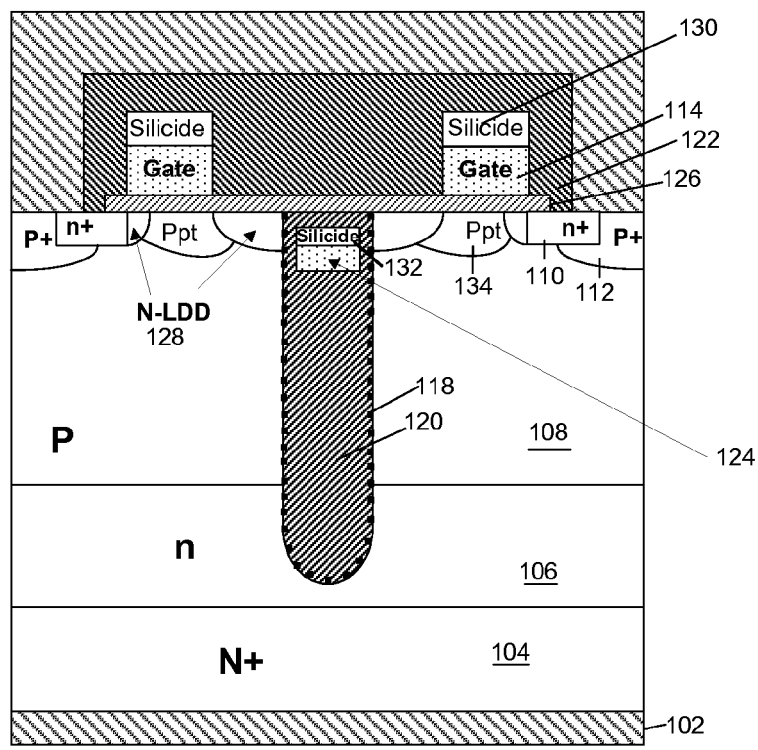
FIG. 9(d) is a cross-sectional structural diagram depicting a trench MOSFET, in accordance with yet another embodiment.

FIG. 9(d) depicts an embodiment which is generally somewhat similar to FIG. 9(b), but which also includes a drift layer 106. This embodiment too provides advantages as described above.

Figure 10A:
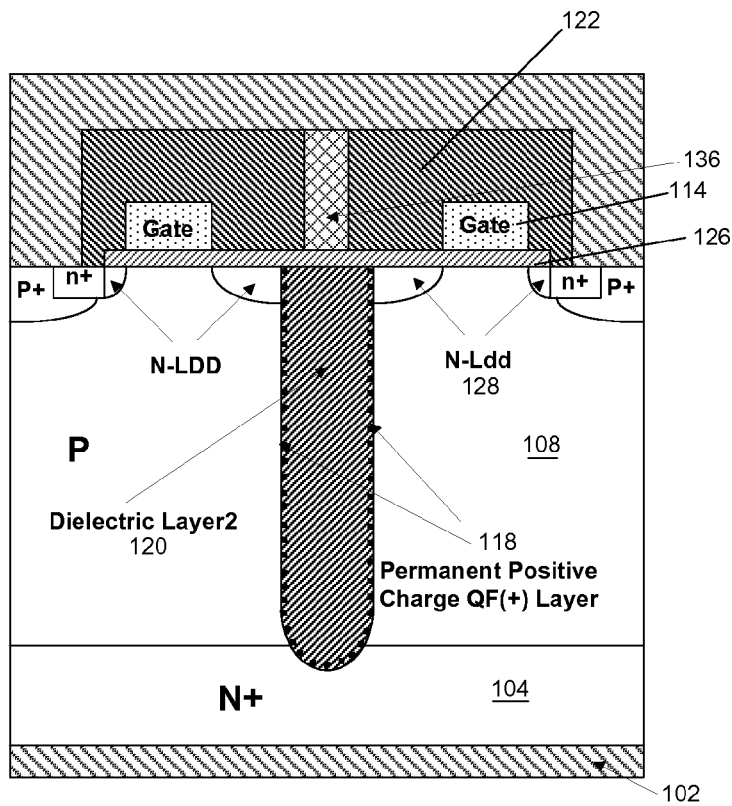
FIG. 10(a) is a cross-sectional structural diagram depicting a trench MOSFET, in accordance with yet another embodiment.

FIG. 10(a) depicts an embodiment including a shield plug 136 in the surface dielectric 122 above the insulation trench 120 and extending to the gate oxide 126. The shield plug 136 can be formed by the source metal or other conducting material such as tungsten. This embodiment too provides advantages as described above.

Figure 10B:
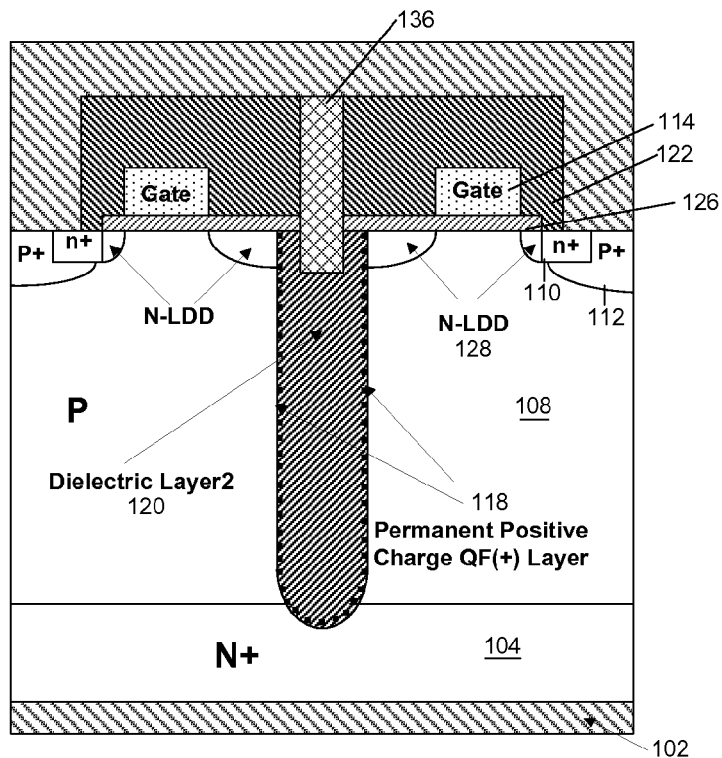
FIG. 10(b) is a cross-sectional structural diagram depicting a trench MOSFET, in accordance with yet another embodiment.

FIG. 10(b) depicts an embodiment which is generally somewhat similar to FIG. 10(a), except that the shield plug 136 extends into the insulation trench 120. This embodiment too provides advantages as described above.

Figure 10C:
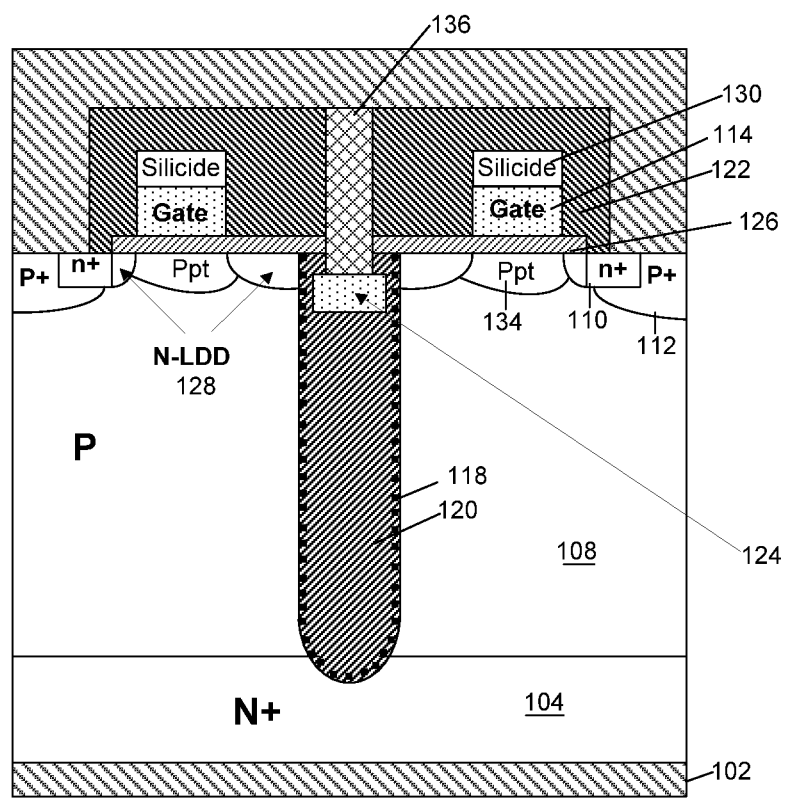
FIG. 10(c) is a cross-sectional structural diagram depicting a trench MOSFET, in accordance with yet another embodiment.

FIG. 10(c) depicts an embodiment which is generally somewhat similar to FIG. 10(b), but which also includes a shield electrode 124 positioned beneath the shield plug 136. This embodiment too provides advantages as described above.

Figure 11A:
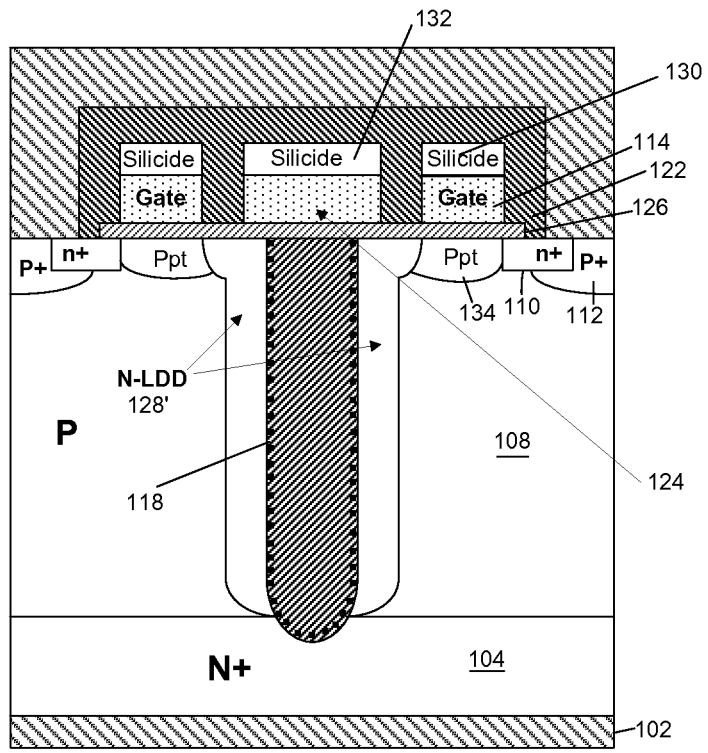
FIG. 11(a) is a cross-sectional structural diagram depicting a trench MOSFET, in accordance with yet another embodiment.

FIG. 11(a) depicts an embodiment including an extended n-type NLDD 128' positioned along the trench side walls. The NLDD layer 128' can be used in combination with permanent charge 118 or completely without permanent charge 118. This embodiment too provides advantages as described above.

Figure 11B:
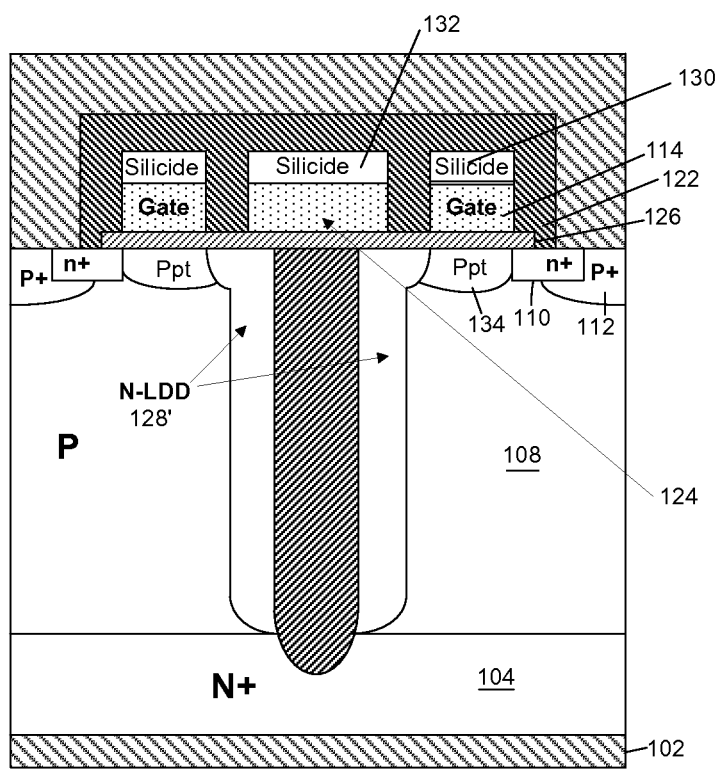
FIG. 11(b) is a cross-sectional structural diagram depicting a trench MOSFET, in accordance with yet another embodiment.

FIG. 11(b) depicts an embodiment which is generally somewhat similar to that of FIG. 11(a), but without the permanent charge 118. This embodiment too provides advantages as described above.

Figure 11C:
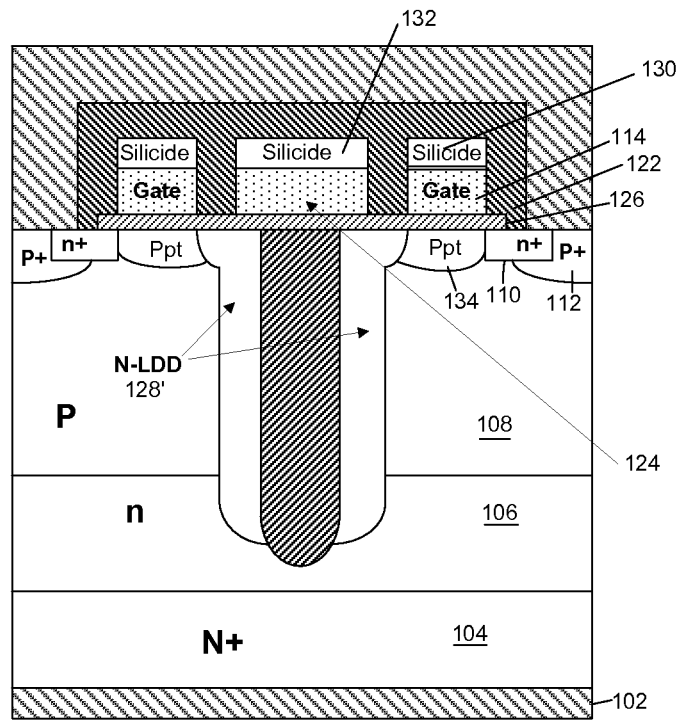
FIG. 11(c) is a cross-sectional structural diagram depicting a trench MOSFET, in accordance with yet another embodiment.

FIG. 11(c) depicts an embodiment which is generally somewhat similar to FIG. 11(b), but including a drift layer 106. This embodiment too provides advantages as described above.

Figure 11D:
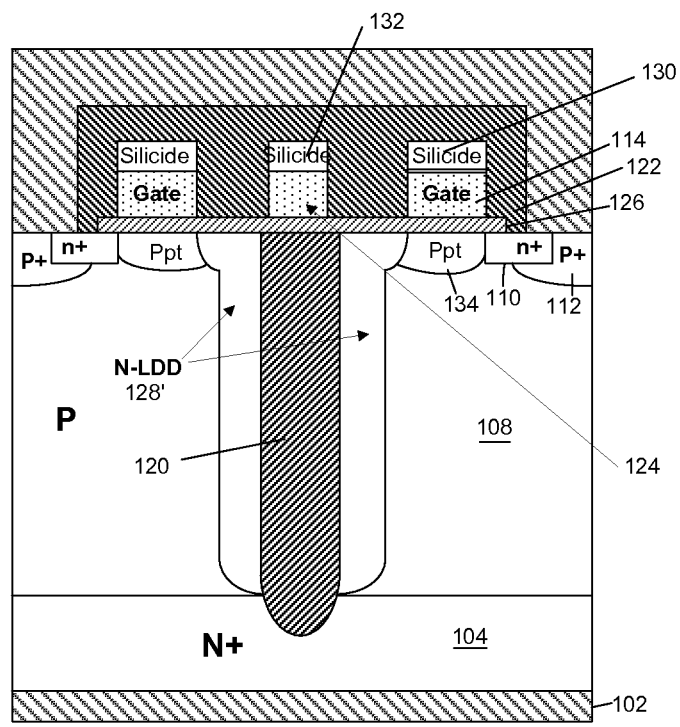
FIG. 11(d) is a cross-sectional structural diagram depicting a trench MOSFET, in accordance with yet another embodiment.

FIG. 11(d) depicts an embodiment which is generally somewhat similar to FIG. 11(b), except that in this embodiment the shield electrode 124 is narrower than the width of the insulation trench 120.

Figure 11E:
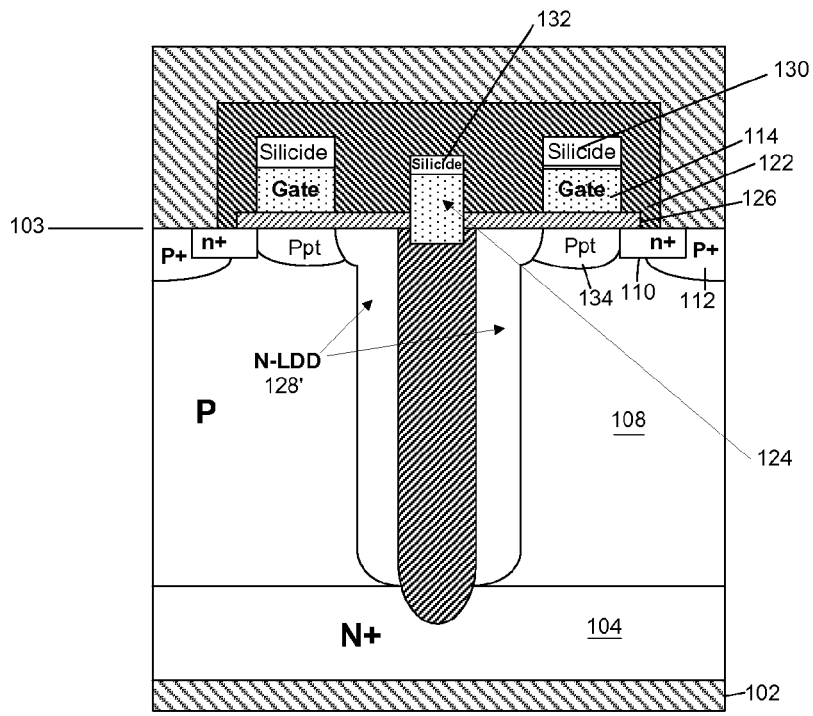
FIG. 11(e) is a cross-sectional structural diagram depicting a trench MOSFET, in accordance with yet another embodiment.

FIG. 11(e) depicts an embodiment which is generally somewhat similar to FIG. 11(d), except that the shield electrode 124 extends downwardly into the insulation trench 120. This embodiment too provides advantages as described above.

Figure 11F:
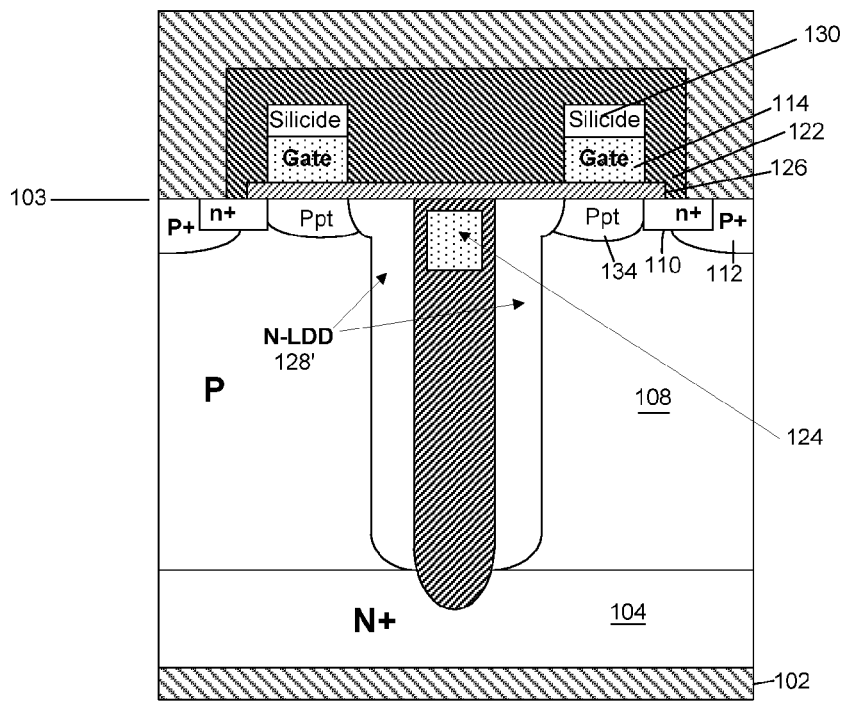
FIG. 11(f) is a cross-sectional structural diagram depicting a trench MOSFET, in accordance with yet another embodiment.

FIG. 11(f) depicts an embodiment which is generally somewhat similar to FIG. 11(b), except that the shield electrode 124 does not adjoin a silicided layer 132, and the shield electrode is contained within the insulation trench 120 below the upper silicon surface. This embodiment too provides advantages as described above.

Figure 11G:
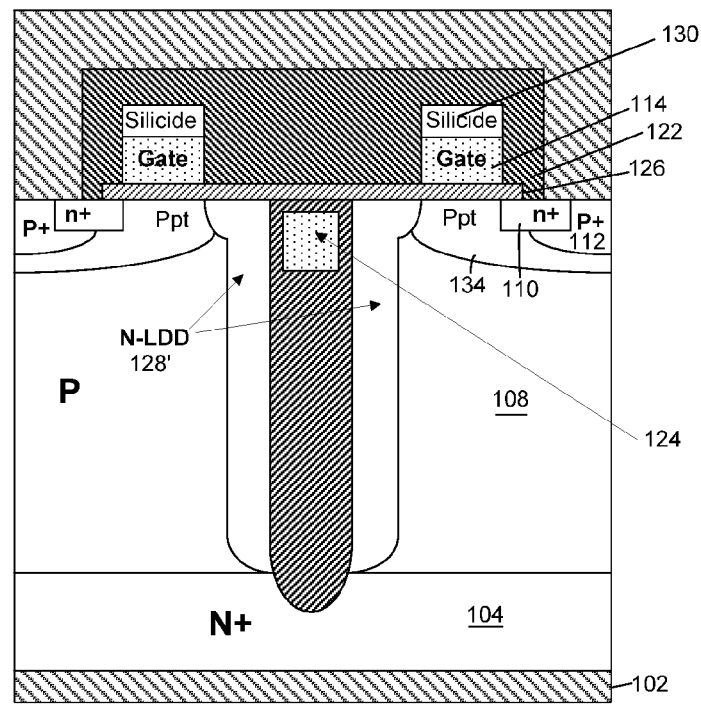
FIG. 11(g) is a cross-sectional structural diagram depicting a trench MOSFET, in accordance with yet another embodiment.

FIG. 11(g) depicts an embodiment which is generally somewhat similar to FIG. 11(f), except that the punch-through layer 134 extends to contact the p-body contact region 112. This embodiment too provides advantages as described above.

Figure 11H:
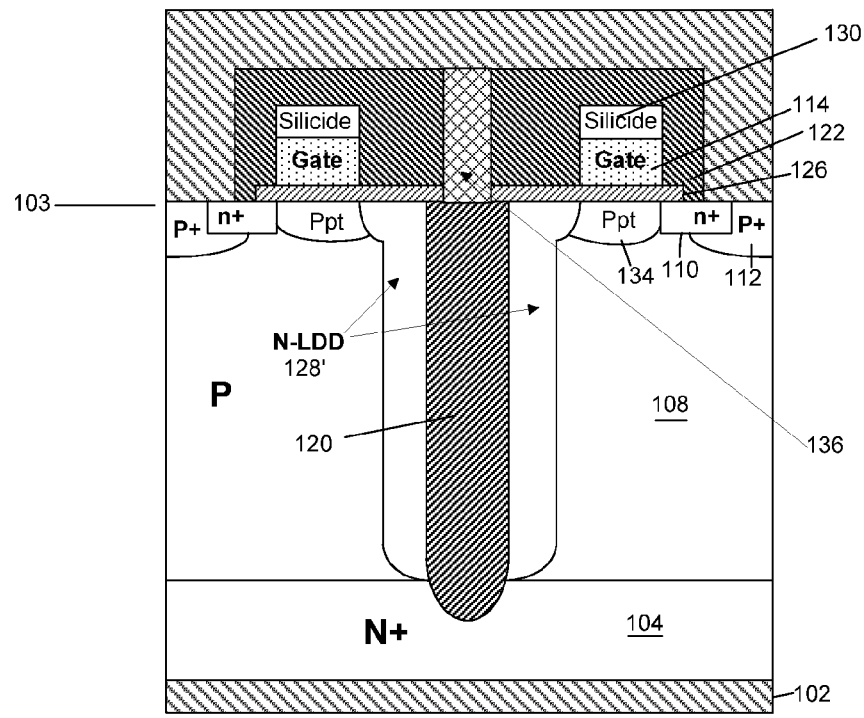
FIG. 11(h) is a cross-sectional structural diagram depicting a trench MOSFET, in accordance with yet another embodiment.

FIG. 11(h) depicts an embodiment which is generally somewhat similar to FIG. 11(b), except that a shield plug 136 extends through the gate oxide 126 contacting the trench insulation 120 at the level of the upper silicon surface. This embodiment too provides advantages as described above.

Figure 11I:
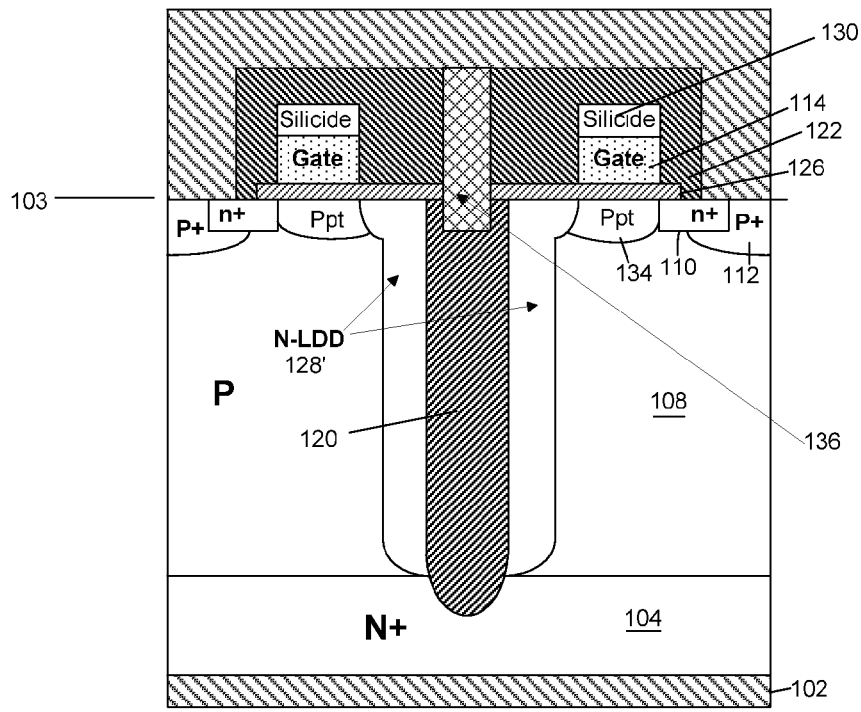
FIG. 11(i) is a cross-sectional structural diagram depicting a trench MOSFET, in accordance with yet another embodiment.

FIG. 11(i) depicts an embodiment which is generally somewhat similar to FIG. 11(h), except that the shield plug 136 extends into the insulation trench 120, below the level of the upper silicon surface. This embodiment too provides advantages as described above.

Figure 11J:
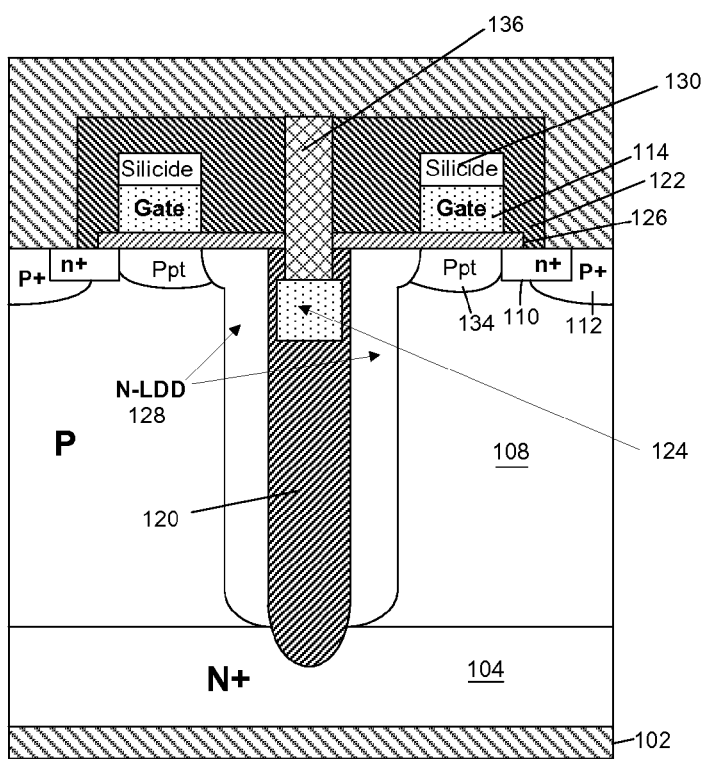
FIG. 11(j) is a cross-sectional structural diagram depicting a trench MOSFET, in accordance with yet another embodiment.

FIG. 11(j) depicts an embodiment which is generally somewhat similar to FIG. 11(i), but which includes a shield electrode 124 adjoining the shield plug 136 within the insulation trench 120. This embodiment too provides advantages as described above.

Figure 12A:
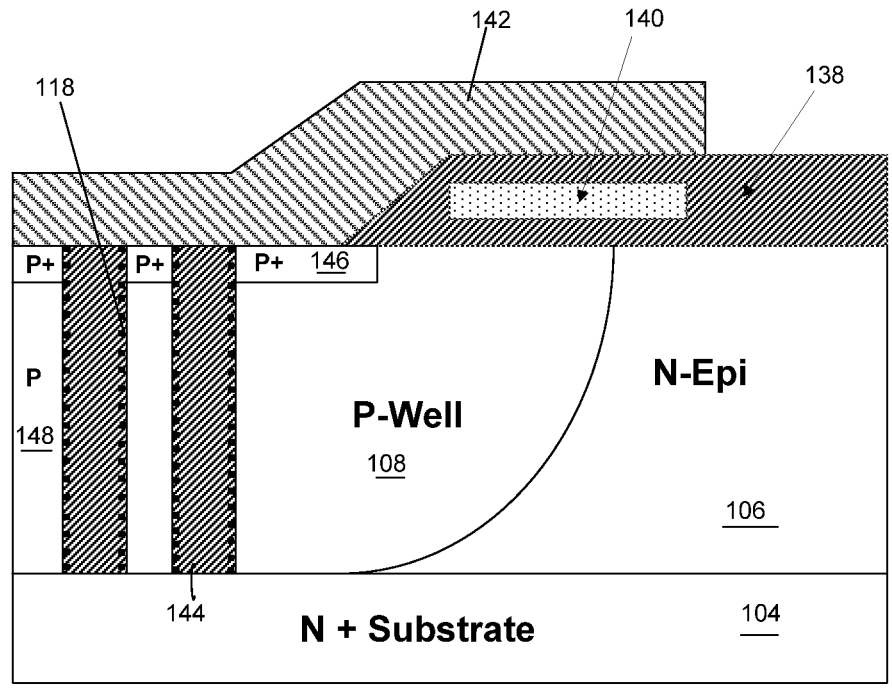
FIG. 12(a) is a cross-sectional structural diagram depicting a termination using a field plate, in accordance with yet another embodiment.

FIG. 12(a) shows a device termination structure, including a field plate 140. A substrate 104 underlies an n-epi region 106 and a p-well region 108. A dielectric layer such as oxide 138 extends over the n-epi region 106 and the p-well region 108, contacting a p+ region 146. Insulation filled trenches 144 alternate with semiconductor material 148, with a contact region 146 at the top. Permanent charge $Q_F$ layer 118 is present in the insulation trenches 144. A conductive layer 142 extends over the termination pattern and the oxide 138. A field plate 140 is positioned within the oxide 138, above the junction between n-epi 106 and p-epi 108. This embodiment too provides advantages as described above.

Figure 12B:
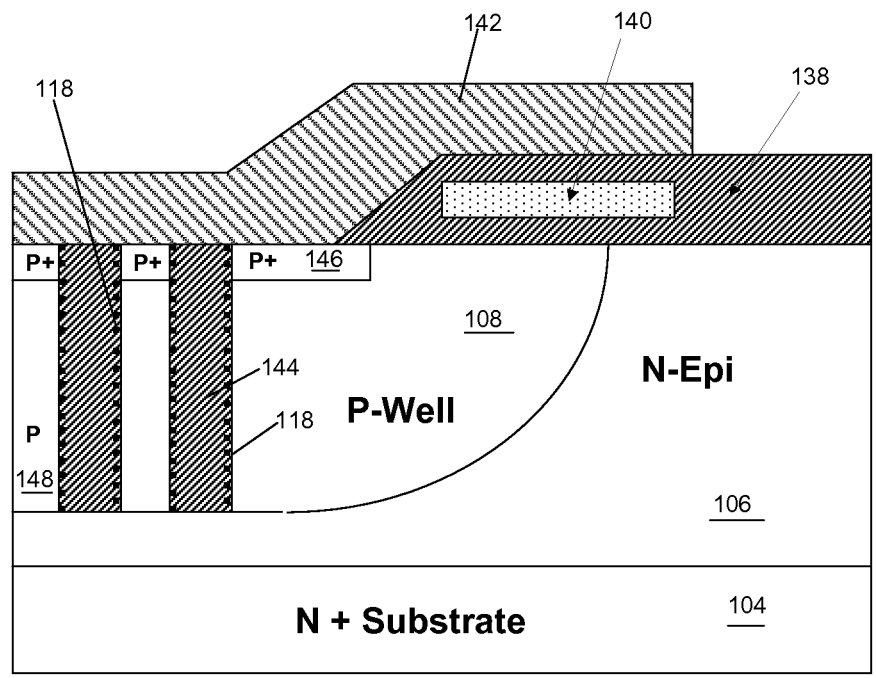
FIG. 12(b) is a cross-sectional structural diagram depicting a termination using a field plate, in accordance with yet another embodiment.

FIG. 12(b) shows a device termination structure which is generally somewhat similar to that of FIG. 12(a), except that in this example the insulation trenches 144 and the P-well region 108 are optionally shallower than the n-epi region 106. This embodiment too provides advantages as described above.

Figure 13:
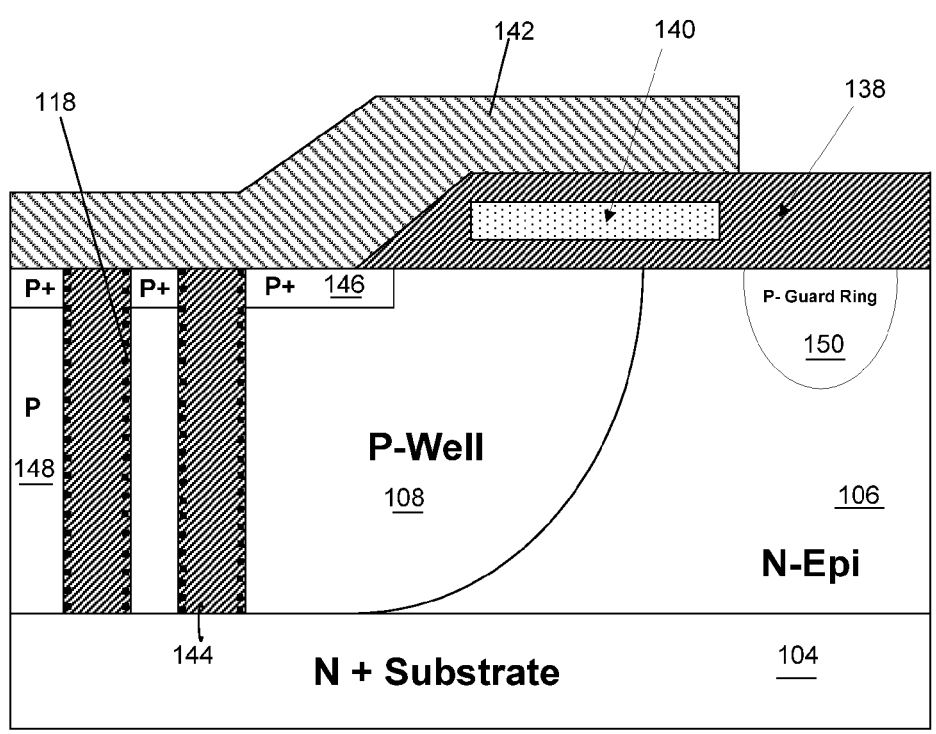
FIG. 13 is a cross-sectional structural diagram depicting a termination using a field plate and a guard ring, in accordance with yet another embodiment.

FIG. 13 shows an embodiment generally somewhat similar to FIG. 12, but including a p-guard ring 150 within the n-epi region 106. Multiple guard rings can also be used. This embodiment too provides advantages as described above.

The foregoing three termination structures can advantageously be used with various of the many device structures described in this application.

In the following section a method of making one version of the structures is described as shown in FIGS. 14 (a)-(m) and 15(a) and (b).

The starting material is a heavily doped n+ substrate 152 doped e.g. with phosphorus or arsenic. A p-type epitaxial layer 154 is grown on top of the n+ substrate 152, as shown in FIG. 14(a).

Alternatively, as shown in FIG. 14(b), an n-type epitaxial layer 158 is used and a p-well 154 is implanted and diffused to form the p-layer.

The dielectric trenches 160 are then etched as shown in FIG. 14(c), using oxide or photoresist mask.

A thin thermal oxide 162 is then grown, e.g. of 300A to 1000A, as shown in FIG. 14(d).

Permanent positive charge 164 is provided using a suitable source such as implanting cesium as shown in FIGS. 14(e) and 14(f). The device is then capped using a polysilicon layer or a dielectric layer such as silicon nitride and annealed using furnace or RTA e.g. at 1050 C.

The polysilicon or nitride layer is then removed and the trench is filled with a dielectric layer 166, such as oxide, as shown in FIG. 14(g).

The remaining surface oxide is removed. Gate oxide 167 is then grown and polysilicon 168, 170 is deposited, doped using n-type doping and then etched using a photoresist mask as shown in FIG. 14(h).

NLDD layer 172 is implanted and it is self-aligned to the gate as shown in FIG. 14(i). Dielectric (oxide) spacers are then formed and the n+ source 173 implanted as shown in FIG. 14(j). Alternatively a photoresist mask 174 is used to define the n+ source implant.

A dielectric layer 176 such as LTO is deposited, contacts are then formed and the p+ layer 178 implanted as shown in FIGS. 14(k) and 14(l).

Contact plugs 180 and source contact metal 188 and drain metal 190 are formed using conducting material such as tungsten, to produce a structure as shown in FIG. 14(m).

An alternative contact can be formed by using a trench contact metal 182 as shown in FIGS. 15(a) and 15(b). An epitaxial layer 108 is positioned on a substrate layer 104. A vertical insulation trench 120 extends through the epitaxial layer 108 to the substrate layer 104. A source region 110 and a body contact region 112 are positioned contacting the epitaxial region 108. Gate electrodes 114 are positioned above the epitaxial layer 108, separated by a gate oxide layer 126. A lightly-doped diffusion 128 is self-aligned with the gate electrode 114 and adjoins the vertical insulation trench 120. A shield electrode 124 is positioned above the vertical insulation trench 120. The gate electrodes 114 and the shield electrode 124 are positioned within a surface insulation layer 122. A trench contact metal 182 connects the source region 110 and the body contact region 112 and the source contact metal 188.

Figure 16A:
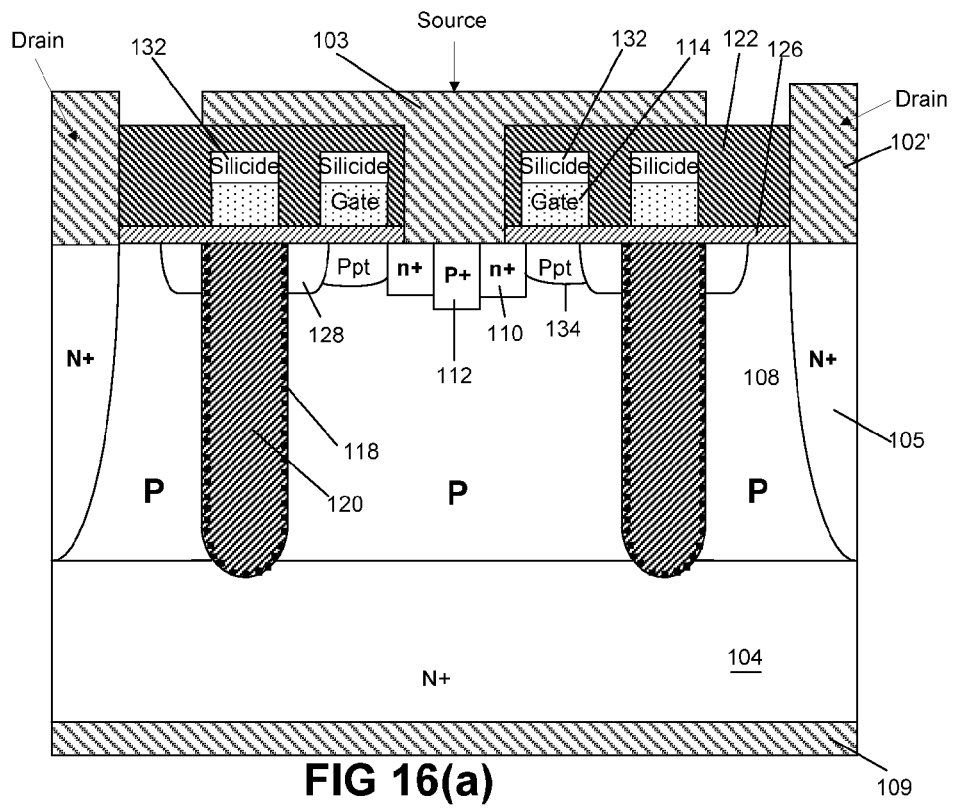
FIG. 16(a) is a cross-sectional structural diagram of a frontside-contacted trench MOSFET, in accordance with yet another embodiment.

FIG. 16(a) shows an embodiment of a frontside-contacted structure that is somewhat similar to that of FIG. 5, except that the drain connection 102' is now located on the frontside of the device. Drain connection 102' is connected to the N+ substrate 104 through the N+ sinker region 105. An optional backside metallization 109 can be used to reduce substrate resistance. In the on-state electron current flows from the source terminal 103 to the drain terminal 102' through the MOS channel, the NLDD layer 128, the inversion layer along the trench side walls formed due to the permanent positive charge, the N-buried layer 104 and the N+ sinker 105.

Such a frontside-contacted device has the advantage of being amenable to integration with other components such as CMOS, Bipolar, or JFET transistors, diodes, resistors and capacitors in a monolithic Integrated Circuit (IC).

Figure 16B:
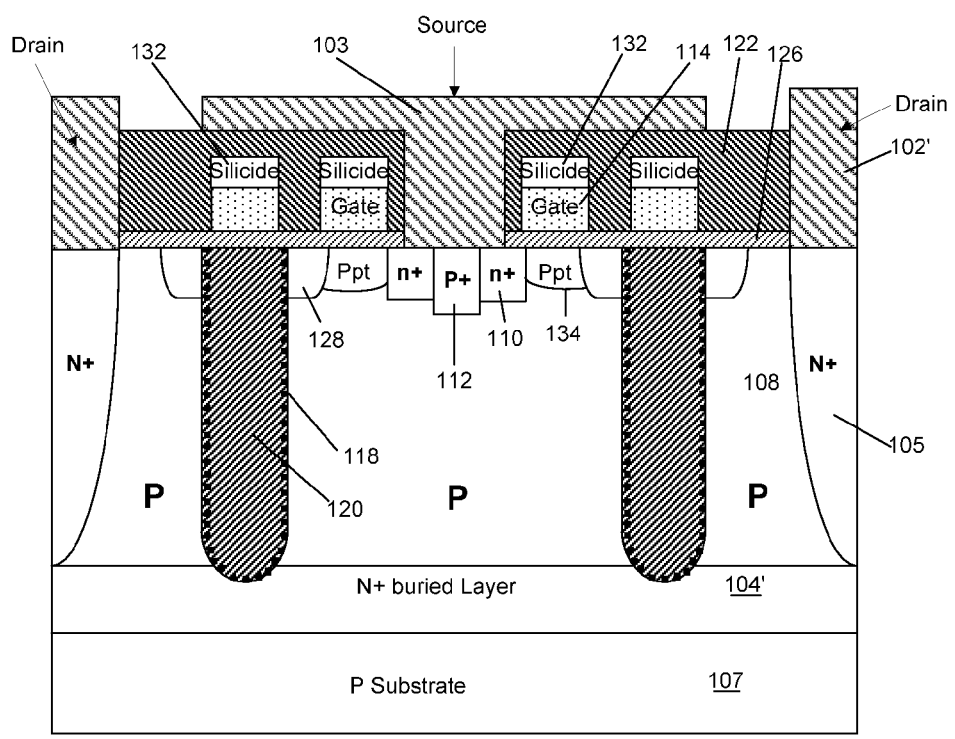
FIG. 16(b) is a cross-sectional structural diagram depicting a frontside-contacted trench MOSFET, in accordance with yet another embodiment.

FIG. 16(b) shows another embodiment of a frontside-contacted structure. This example is somewhat similar to that of FIG. 16(a), except that the N+ substrate 104 has been replaced by an N-buried layer 104' formed on a p-type substrate 107. Here too the drain contact 102' is on the surface, so that the N+ buried layer 104' is contacted through, for example, a deep N+ sinker region 105.

Figure 17A:
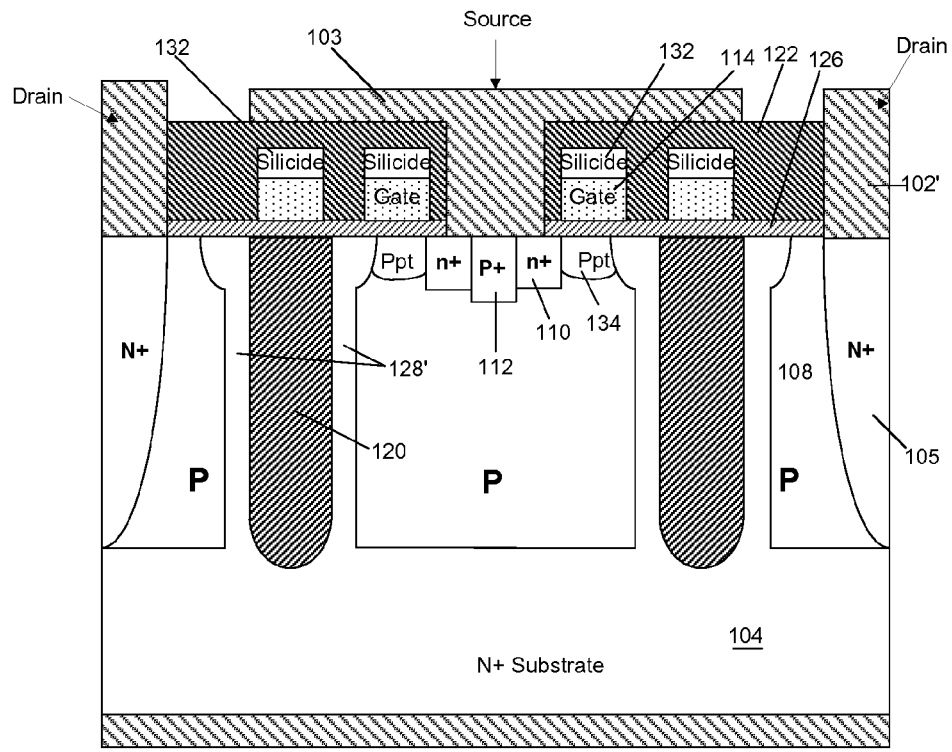
FIG. 17(a) is a cross-sectional structural diagram depicting a frontside-contacted trench MOSFET, in accordance with yet another embodiment.

FIG. 17(a) depicts another embodiment of a frontside-contacted structure. This example too is somewhat similar to that shown in FIG. 16(a), except that this embodiment includes an extended n-layer NLDD 128' positioned along the trench side walls. The NLDD layer 128' can be used in combination with permanent charge 118 or completely without permanent charge 118.

Figure 17B:
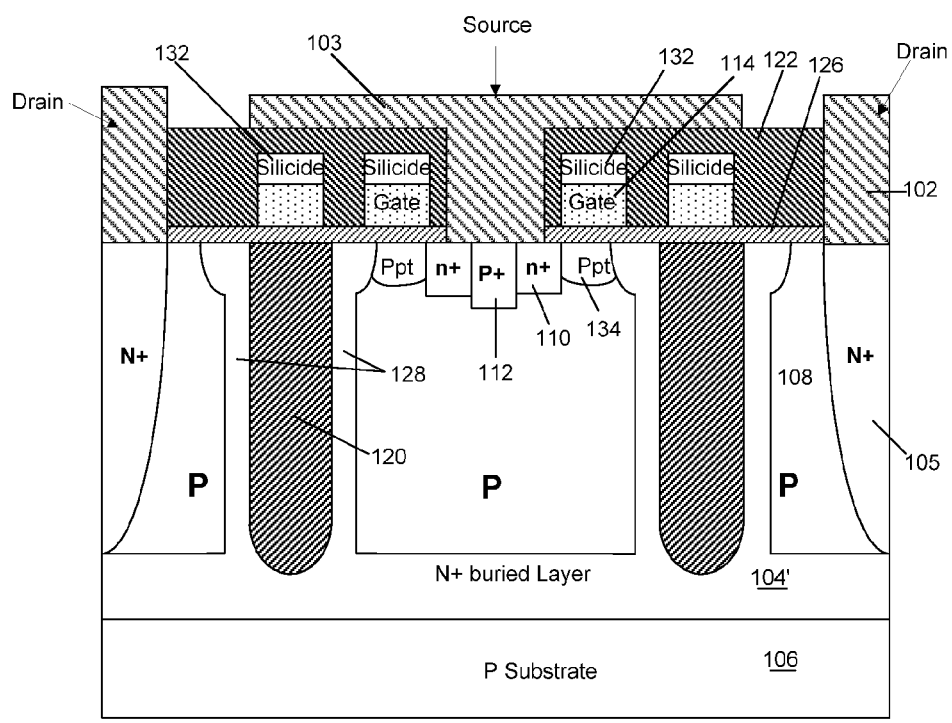
FIG. 17(b) is a cross-sectional structural diagram depicting a frontside-contacted trench MOSFET, in accordance with yet another embodiment.

FIG. 17(b) depicts an embodiment of a quasi-vertical structure which is somewhat similar to that shown in FIG. 16(b), but which also includes a p-layer NLDD 128' positioned along the trench side walls. The NLDD layer 128' can be used in combination with permanent charge 118 or completely without permanent charge 118.

Figure 18:
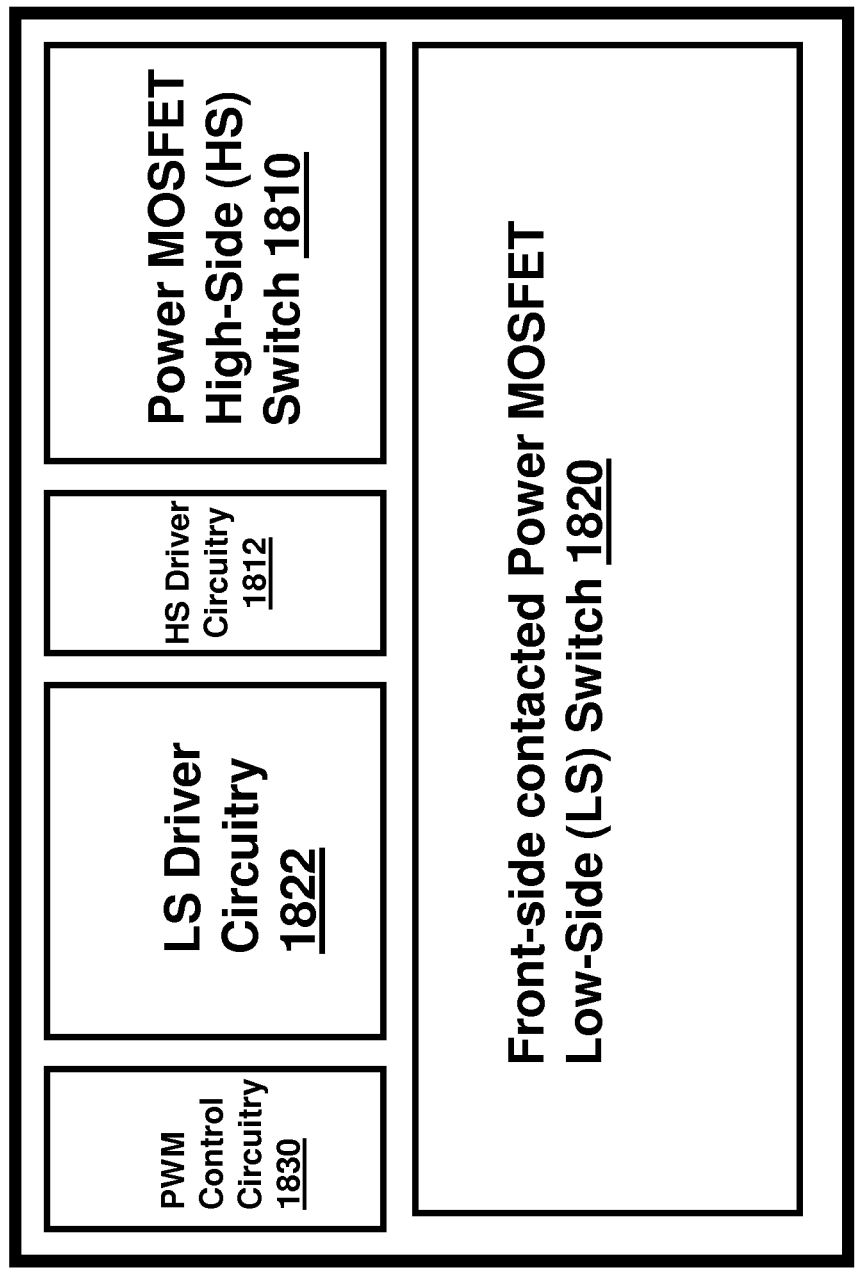
FIG. 18 shows an integrated circuit, which includes a frontside-contacted power device in combination with lower-power integrated circuitry.

FIG. 18 shows an example of an integrated power device. The example shown is a DC-DC converter. This device contains two large power device arrays as described above: Device array 1820 is the low-side switch, which pulls the common output terminal towards the lower supply voltage, and device array 1810 is the high-side switch, which pulls the common output terminal toward the higher supply voltage. In this example, both switches use device technology as shown e.g. in FIG. 16*b* or 17*b* above. The device structures of 1810 and 1820 can be the same or different.

Each of the switches is operated by a respective driver circuit. The high-side (HS) driver stage 1812 provides the required drive current and bias point for the HS switch 1810, and low-side (LS) driver circuit 1822 provides the required drive current and bias point for the LS switch 1820.

The pulse-width-modulation ("PWM") circuitry 1830 is a lower-voltage circuit, which provides width-modulated pulse trains to the driver stages 1812 and 1822. Thus, for example, the PWM circuitry can include a comparator which sees the difference between a fed-back voltage and a commanded voltage, and changes the pulse train fed to one of the driver stages accordingly. (Typically common-mode conduction is avoided, so only one of the switch stages is driven at any one instant.)

According to various embodiments, there is provided: a vertical power device comprising: an insulated trench containing insulation material; a surface insulation layer including a gate electrode; a body region positioned so that a voltage bias applied to the gate electrode will cause an inversion layer in said body region; permanent electrostatic charges in said trench insulation material; and a conductive shield layer positioned within said surface insulation layer above said insulated trench.

According to various embodiments, there is provided: a vertical semiconductor device comprising: an insulated trench containing insulation material; a surface insulation layer containing at least two gate electrodes; a body region positioned so that a voltage bias applied to one of the gate electrodes will cause an inversion layer in said body region; and permanent electrostatic charges in said insulation trench; and lightly doped regions overlapping said gate electrodes.

According to various embodiments, there is provided: a vertical semiconductor device comprising: an insulated trench containing insulation material; a surface insulation layer containing at least two gate electrodes; a body region positioned so that a voltage bias applied to one of the gate electrodes will cause an inversion layer in said body region; permanent electrostatic charges in said insulation material; and a conductive shield layer positioned between said gate electrodes within said surface insulation layer.

According to various embodiments, there is provided: a lateral trench semiconductor device comprising: a gate electrode positioned above a body region such that a voltage bias applied to said gate electrode causes an inversion layer in said body region; an insulated trench including permanent electrostatic charges at a boundary between said insulated trench and semiconductor material having a first conductivity type, such that the permanent charge causes an inversion layer in said semiconductor material; and a punch-through layer having said first conductivity type and positioned between said body region and said insulated trench.

According to various embodiments, there is provided: a planar trench semiconductor device comprising: at least two gate electrodes positioned above body regions such that a voltage bias applied to a gate electrode causes an inversion layer in a body region; an insulated trench including permanent electrostatic charges at a boundary between said insulated trench and semiconductor material having a polarity type, such that the permanent electrostatic charge causes an inversion layer in said semiconductor material; a punch-through layer having said first conductivity type and positioned between a body region and said insulated trench; and a conductive shield layer positioned between said gate electrodes.

According to various embodiments, there is provided: a method for operating a vertical semiconductor device, comprising: gating emission of first-type majority carriers from a source region using a control gate; and routing said majority carriers through an induced drain extension in a second-type semiconductor volume; said induced drain extension comprising an excess of said first-type carriers along the face of a dielectric trench in contact with said semiconductor volume, said dielectric having charge and its surface in contact with said semiconductor volume.

According to various embodiments, there is provided: methods and systems for vertical power devices including an insulated trench containing insulation material and a surface insulation layer including a gate electrode. A body region is positioned so that a voltage bias applied to the gate electrode will cause an inversion layer in the body region. Permanent charges are included in said insulation material. A conductive shield layer is positioned within the surface insulation layer above the insulated trench.

According to various embodiments, there is provided: a vertical power device comprising: an insulated trench having a sidewall; a gate electrode; a lightly doped diffusion layer adjacent to said sidewall of said insulated trench such that a voltage bias applied to the gate electrode can induce inversion in said lightly doped diffusion layer to thereby create a channel; permanent charge positioned near said sidewall; and a conductive shield layer which is positioned above said insulated trench, and not electrically connected to said gate.

According to various embodiments, there is provided: a vertical device comprising: a source region; a body region separating said source region from a drain region; a gate electrode positioned such that when a voltage bias is applied to said gate electrode, an inversion region is induced in said body region; a vertical insulation trench through said body region; and a lightly-doped diffusion in said body region along said vertical insulation trench.

According to various embodiments, there is provided: a vertical device comprising: a source region; a body region separating said source region from a drain region; a gate electrode positioned such that when a voltage bias is applied to said gate electrode, an inversion region is induced in said body region; a vertical insulation trench through said body region; permanent charge positioned along an exterior edge of said vertical insulation trench, and a lightly-doped diffusion in said body region along said vertical insulation trench.

According to various embodiments, there is provided: a vertical device comprising: a source region; a body region separating said source region from a drift region, said drift region adjoining a drain region; a gate electrode positioned such that when a voltage bias is applied to said gate electrode, an inversion region is induced in said body region; a vertical insulation trench through said body region; and a lightly-doped diffusion in said body region along said vertical insulation trench.

According to various embodiments, there is provided: a vertical device comprising: source regions; body regions separating said source regions from drain regions; gate electrodes positioned such that when a voltage bias is applied to said gate electrode, an inversion region is induced in said body region; a vertical insulation trench through said body region; a shield electrode between said gate electrodes and above said vertical insulation trench; and a lightly-doped diffusion in said body region along said vertical insulation trench.

According to various embodiments, there is provided: a vertical device comprising: source regions; body regions separating said source regions from drain regions; gate electrodes positioned such that when a voltage bias is applied to said gate electrode, an inversion region is induced in said body region; a vertical insulation trench through said body region; a shield electrode between said gate electrodes and above said vertical insulation trench; and a lightly-doped diffusion in said body region along said vertical insulation trench.

According to various embodiments, there is provided: A vertical device comprising: source regions; body regions separating said source regions from drain regions; gate electrodes positioned such that when a voltage bias is applied to said gate electrode, an inversion region is induced in said body region; a vertical insulation trench through said body region; a shield electrode between said gate electrodes and extending into said vertical insulation trench; and a lightly-doped diffusion in said body region along said vertical insulation trench.

According to various embodiments, there is provided: a vertical device comprising: source regions; body regions separating said source regions from drain regions; gate electrodes positioned such that when a voltage bias is applied to said gate electrode, an inversion region is induced in said body region; a vertical insulation trench through said body region; a shield electrode within said vertical insulation trench; and a lightly-doped diffusion in said body region along said vertical insulation trench.

According to various embodiments, there is provided: a vertical device comprising: source regions; body regions separating said source regions from drain regions; gate electrodes positioned such that when a voltage bias is applied to said gate electrode, an inversion region is induced in said body region; a vertical insulation trench through said body region; a shield electrode within said vertical insulation trench; and a lightly-doped diffusion in said body region along said vertical insulation trench.

According to various embodiments, there is provided: a vertical device comprising: a source region; a body region separating said source region from a drain region; a body contact region adjoining said body region and said source region; a gate electrode positioned such that when a voltage bias is applied to said gate electrode, an inversion region is induced in said body region; a vertical insulation trench through said body region; a lightly-doped diffusion in said body region along said vertical insulation trench; and a punch-through diffusion between the source region and the lightly-doped diffusion, wherein said punch-through diffusion adjoins said body contact region.

According to various embodiments, there is provided: A vertical device comprising: source regions; body regions separating said source regions from drain regions; gate electrodes positioned such that when a voltage bias is applied to said gate electrode, an inversion region is induced in said body region; a vertical insulation trench through said body region; a shield plug between said gate electrodes and above said vertical insulation trench; and a lightly-doped diffusion in said body region along said vertical insulation trench.

According to various embodiments, there is provided: a vertical device comprising: source regions; body regions separating said source regions from drain regions; gate electrodes positioned such that when a voltage bias is applied to said gate electrode, an inversion region is induced in said body region; a vertical insulation trench through said body region; a shield plug between said gate electrodes and extending into said vertical insulation trench; and a lightly-doped diffusion in said body region along said vertical insulation trench.

According to various embodiments, there is provided: a vertical device comprising: source regions; body regions separating said source regions from drain regions; gate electrodes positioned such that when a voltage bias is applied to said gate electrode, an inversion region is induced in said body region; a vertical insulation trench through said body region; a shield plug between said gate electrodes and above said vertical insulation trench; a shield electrode within said vertical insulation trench; and a lightly-doped diffusion in said body region along said vertical insulation trench.

According to various embodiments, there is provided: a method of fabricating a vertical device, comprising: depositing an epitaxial layer on a substrate layer; etching a trench in said epitaxial layer; depositing an oxide layer within said trench; implanting permanent charges within said oxide layer; filling said trench with dielectric material; growing a gate oxide layer; and implanting doped diffusions along said trench.

According to various embodiments, there is provided: a method of fabricating a vertical device, comprising: depositing an epitaxial layer on a substrate layer; etching a trench in said epitaxial layer; depositing an oxide layer within said trench; implanting permanent charges within said oxide layer; filling said trench with dielectric material; growing a gate oxide layer; etching contact trenches in said epitaxial layer; and implanting doped diffusions along said trench.

According to various embodiments, there is provided: an integrated circuit, comprising: at least one power device, which includes a MOS-gated lateral channel structure, near a frontside of the device, merged with a substantially vertical drift conduction path which lies along the sidewall of a trench, which includes a conductive shield near the top of said trench, which includes a lateral conductor beneath said drift conduction path, and which also includes a connection to said lateral conductor from the frontside of the device; and a plurality of integrated circuit components, integrated with said power device on a common substrate, and connected with said power device to provide joint functionality; wherein said MOS-gate lateral channel structure includes at least some device elements which are also present in ones of said integrated circuit components.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

It should be noted that the specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in any way. It is understood by those of ordinary skill in the art that the actual cell layout such as stripe, cellular (square, rectangular, hexagonal, etc.) will vary depending on the specifics of the implementation and any depictions illustrated herein should not be considered a limitation in any way.

While only n-channel MOSFETs are shown here, p-channel MOSFETs are realizable with this invention simply by changing the polarity of the permanent charge and swapping n-type and p-type regions in any of the figures. This is well known to those of ordinary skill in the art.

While only n-channel MOSFETs are shown here, the disclosed inventions can also be applied to other devices such as IGBTs.

The semiconductor material has been generally referred to above as "silicon," but other semiconductor materials can be used instead. One obvious example is $Si_{0.9}Ge_{0.1}$, but many others are possible.

It should be noted in the above drawings the positive permanent charge was drawn for illustration purpose only. It is understood that the charge can be in the dielectric (oxide), at the interface between the silicon and oxide, inside the silicon layer, or a combination of all these cases.

While described as discrete devices, the embodiments could be realized as integrated devices, in particular with the use of an N+ buried and heavily doped N+ deep diffusion (sinker) layers.

It is also understood that numerous combinations of the above embodiments can be realized.

It is understood by those of ordinary skill in the art that other variations to the above embodiments can be realized using other known termination techniques.

It should be noted that the term "MOS" is commonly used in semiconductor physics to refer to a variety of structures where a conductive plate is separated from a semiconductor material by a thin nonconductive layer. The nonconductive layer can be a grown oxide (such as silicon dioxide), or can be a thin layer of another dielectric. The conductive layer can be a metal layer such as tungsten, or can be (for just one example) heavily doped polycrystalline semiconductor material.

The following U.S. applications may contain additional information and alternative modifications, and all are hereby incorporated by reference: Ser. No. 11/971,096 (US2008-0191307); Ser. No. 11/971,123 (US2008-0164516); Ser. No. 11/971,139 (US2008-0164518); Ser. No. 11/971,152 (US2008-0164520); Ser. No. 11/971,169 (US2008-0166845); Ser. No. 12/367,716 (US52009-0206913); Ser. No. 12/368,399 (US2009-0206924); Ser. Nos. 12/369,385; 12/391,450; 12/392,131; 12/394,107; 12/418,808; 12/431,005; 12/431,852; 12/432,917; and Ser. No. 12/545,808. These generally have common assignee and overlapping inventorship with the present application, as well as direct or indirect copendency, none are admitted to be prior art. All of these are hereby incorporated by reference herein for all purposes.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A substantially vertical device comprising:
a first-conductivity-type source region;
an insulated trench having an approximately vertical sidewall;
a gate electrode;
a semiconductor body region positioned so that voltage bias applied to the gate electrode can induce inversion in said body region to thereby create a lateral channel; said body region being positioned to separate said source region from said trench;
a first-conductivity type drain extension region positioned in proximity to said trench, and leading from said channel to said sidewall of said trench;
permanent electrostatic charge positioned near said sidewall in density sufficient to invert at least some second-conductivity semiconductor material adjacent thereto; and
a conductive shield layer which is positioned above said insulated trench, and not electrically connected to said gate.

2. The device of claim 1, wherein said insulated trench, below said shield, is completely filled with dielectric.

3. The device of claim 1, wherein said shield is taller in height than said gate electrode.

4. The device of claim 1, wherein said shield lies partly within said trench.

5. The device of claim 1, wherein said shield lies entirely within said trench.

6. The device of claim 1, wherein said shield is wider than said trench.

7. The device of claim 1, further comprising a lightly doped region, of opposite conductivity type to said body, which is interposed between said trench and the location of said channel.

8. The device of claim 1, wherein said trench penetrates from the surface of a semiconductor mass into a p-type layer, and also penetrates therethrough into an n-type drain layer.

9. The device of claim 1, wherein said gate electrode and said shield are both made of silicide.

10. The device of claim 1, wherein said permanent electrostatic charge comprises embedded cesium ions.

11. The device of claim 1, built in a semiconductor structure which includes an epitaxial layer over an N+ buried layer over a P+ substrate, wherein said buried layer is contacted by a sinker diffusion.

12. A substantially vertical semiconductor device comprising:
an insulated trench;
a surface insulation layer containing at least two physically separated gate electrode portions;
a body region positioned so that a voltage bias applied to one of the gate electrodes will cause an inversion layer in said body region;
permanent charges positioned in said insulation material; and
a conductive shield layer positioned between said gate electrodes within said surface insulation layer.

13. The device of claim 12, wherein said insulated trench, below said shield, is completely filled with dielectric.

14. The device of claim 12, wherein said shield is taller in height than said gate electrodes.

15. The device of claim 12, wherein said shield lies partly within said trench.

16. The device of claim 12, wherein said shield lies entirely within said trench.

17. The device of claim 12, wherein said shield is wider than said trench.

18. The device of claim 12, further comprising a lightly doped region, of opposite conductivity type to said body, which is interposed between said trench and the location of said channel.

19. The device of claim 12, wherein said trench penetrates from the surface of a semiconductor mass into a p-type layer, and also penetrates therethrough into an n-type drain layer.

20. The vertical semiconductor device of claim 12, further comprising a drain region wherein said conductive shield electrode reduces gate-drain capacitance.

\* \* \* \* \*